(12) United States Patent
Choi et al.

(10) Patent No.: US 11,355,685 B2
(45) Date of Patent: Jun. 7, 2022

(54) LIGHT EMITTING DIODE, LIGHT EMITTING DIODE MODULE, AND DISPLAY DEVICE HAVING THE LIGHT EMITTING DIODE MODULE

(71) Applicant: Seoul Semiconductor Co., Ltd., Ansan-si (KR)

(72) Inventors: Seung Li Choi, Ansan-si (KR); Se Min Bang, Ansan-si (KR); Se Won Tae, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 73 days.

(21) Appl. No.: 16/557,184

(22) Filed: Aug. 30, 2019

(65) Prior Publication Data

US 2019/0393392 A1 Dec. 26, 2019

Related U.S. Application Data

(63) Continuation of application No. PCT/KR2019/005826, filed on May 5, 2019.

(30) Foreign Application Priority Data

May 18, 2018 (KR) .......................... 10-2018-0056896
May 7, 2019 (KR) .......................... 10-2019-0053271

(51) Int. Cl.
*H01L 33/62* (2010.01)
*H01L 33/36* (2010.01)
*G02F 1/13357* (2006.01)
*H01L 33/50* (2010.01)
(Continued)

(52) U.S. Cl.
CPC ........ *H01L 33/62* (2013.01); *G02F 1/133603* (2013.01); *H01L 33/36* (2013.01); *H01L 33/50* (2013.01); *H05K 2201/09472* (2013.01)

(58) Field of Classification Search
CPC ....... H01L 33/62; H01L 33/486; H01L 33/50; H01L 33/36; G02F 1/133603;
(Continued)

(56) References Cited

U.S. PATENT DOCUMENTS 8,410,502 B2  4/2013 Okamoto et al.
10,026,718 B2 7/2018 Nakabayashi et al.
(Continued)

FOREIGN PATENT DOCUMENTS

JP  2009-044112  2/2009
JP  2011-054736  3/2011
(Continued)

OTHER PUBLICATIONS

Extended European Search Report dated Dec. 6, 2021, issued in European Patent Application No. 19804513.0.
(Continued)

*Primary Examiner* — Marcos D. Pizarro
*Assistant Examiner* — Antonio B Grite
(74) *Attorney, Agent, or Firm* — H.C. Park & Associates, PLC

(57) ABSTRACT

A light emitting diode including a lead frame unit and a light source unit disposed on the lead frame unit, in which the lead frame unit includes a body portion having a first surface contacting the light source unit and a second surface opposite to the first surface, at least one solder hole recessed from the second surface of the body portion, a first conductive layer disposed on the first surface of the body portion and including a circular portion having a substantially circular shape and an elongated portion provided integrally with the circular portion and elongating in one direction from the circular portion, a second conductive layer disposed on the second surface of the body portion, and a connection portion
(Continued)

disposed between the first conductive layer and the second conductive layer and penetrating through the body portion.

18 Claims, 24 Drawing Sheets

(51) Int. Cl.
    *H01L 27/15*     (2006.01)
    *H01L 33/38*     (2010.01)
    *H01L 33/48*     (2010.01)
    *H01L 25/075*     (2006.01)

(58) Field of Classification Search
    CPC ....... H05K 2201/09472; H05K 3/3442; H05K 3/3431; F21V 23/06; H05B 45/00
    See application file for complete search history.

(56) References Cited

U.S. PATENT DOCUMENTS

| | | |
|---|---|---|
| 10,041,663 B2 | 8/2018 | Motoyuki et al. |
| 2012/0205677 A1* | 8/2012 | Kobayakawa ...... H01L 25/0753 257/88 |
| 2014/0197447 A1 | 7/2014 | Kitano et al. |
| 2015/0060903 A1 | 3/2015 | Harvey et al. |
| 2017/0186735 A1 | 6/2017 | Kobayakawa et al. |
| 2017/0244010 A1* | 8/2017 | Kim .................... H01L 25/0753 |
| 2018/0080641 A1* | 3/2018 | Tanaka .................. F21V 9/30 |
| 2018/0315897 A1* | 11/2018 | Nakabayashi .......... H01L 33/50 |

FOREIGN PATENT DOCUMENTS

| | | |
|---|---|---|
| JP | 2013-110179 | 6/2013 |
| JP | 2017-188589 | 10/2017 |
| JP | 2018-049953 | 3/2018 |
| KR | 10-2009-0083202 | 8/2009 |
| WO | 2013/027568 A1 | 2/2013 |

OTHER PUBLICATIONS

Office Action dated Feb. 14, 2022 for Indian Patent Application No. 202037051820 (with English Translation).

* cited by examiner

LIGHT EMITTING DIODE, LIGHT EMITTING DIODE MODULE, AND DISPLAY DEVICE HAVING THE LIGHT EMITTING DIODE MODULE

CROSS-REFERENCE TO RELATED APPLICATIONS

This application is a Bypass Continuation of International Patent Application No. PCT/KR2019/005826, filed on May 5, 2019, and claims priority from and the benefit of Korean Patent Application No. 10-2018-0056896, filed on May 18, 2018, and Korean Patent Application No. 10-2019-0053271, filed on May 7, 2019, each of which is hereby incorporated by reference for all purposes if fully set forth herein.

BACKGROUND

Field

Exemplary embodiments of the invention relate generally to a light emitting diode, a light emitting diode module, and a display device having the light emitting diode module and, more specifically, to a light emitting diode, a light emitting diode module, and a display device having the same with improved reliability.

Discussion of the Background

In general, a light emitting diode is broadly classified into a top-emission type light emitting diode and a side-emission type light emitting diode. A side-emission type light emitting diode package, in which light is incident into a side surface of a light guide plate, is widely used as a light source for a backlight of a display device. In recent years, the side-emission type light emitting diode package is becoming more widely used and applied in many fields in addition to a backlight of a conventional display device.

Recently, as a thickness of the display device becomes thinner, a thickness of the side-emission type light emitting diode package is also becoming thinner. When the thickness of the side-emission type light emitting diode package decreases, a space between a light emitting diode chip and a reflector becomes narrower. As such, a design for heat dissipation is required according to a temperature rise from the narrowed space.

The above information disclosed in this Background section is only for understanding of the background of the inventive concepts, and, therefore, it may contain information that does not constitute prior art.

SUMMARY

A light emitting diode, a light emitting diode module, and a display device having the light emitting diode module constructed according to exemplary embodiments of the invention are free from disconnection and have excellent heat resistance.

A light emitting diode, a light emitting diode module, and a display device having the light emitting diode module according to exemplary embodiments also have a thin thickness and a high degree of integration.

Additional features of the inventive concepts will be set forth in the description which follows, and in part will be apparent from the description, or may be learned by practice of the inventive concepts.

A light emitting diode according to an exemplary embodiment includes a lead frame unit, and a light source unit disposed on the lead frame unit, the lead frame unit including a body portion having a first surface contacting the light source unit and a second surface opposite to the first surface, the body portion including at least one solder hole recessed from the second surface of the body portion, a first conductive layer disposed on the first surface of the body portion and including a circular portion having a substantially circular shape and an elongated portion provided integrally with the circular portion and elongating in one direction from the circular portion, a second conductive layer disposed on the second surface of the body portion, and a connection portion disposed between the first conductive layer and the second conductive layer and penetrating through the body portion.

The elongated portion may have a width less than a diameter of the circular portion.

The connection portion may overlap at least a portion of the circular portion in a plan view.

The connection portion may be disposed on a through hole defined through the body portion and may include a connection portion conductive layer disposed on a surface of the through hole, a plug disposed on the connection portion conductive layer and filling the through hole, and a cover plate disposed on the through hole to cover the through hole.

The cover plate may have a same shape as the connection portion conductive layer on the first surface and the second surface of the body portion.

The lead frame unit may have a third surface connecting the first surface and the second surface, and the solder hole may be defined over the second surface and the third surface.

The solder hole may have a substantially semi-circular or substantially semi-elliptical shape in the second surface of the body portion, and may have a substantially pentagonal shape in the third surface, and at least one internal angle defined by the pentagonal shape may be in a range from about 120 degrees to about 170 degrees.

The solder hole may have a substantially semi-circular or substantially semi-elliptical shape in the second surface of the body portion, and a radius of the substantially semi-circular or substantially semi-elliptical shape may be in a range from about 10% to about 50% of a thickness of the body portion.

The light emitting diode may further include a solder insulating layer disposed on the second surface, in which the solder insulating layer may cover at least a portion of the second conductive layer disposed between the solder holes.

The solder hole and the connection portion may be spaced apart from each other by at least about 50 μm when viewed from the second surface.

The light source unit may include a first light emitting diode chip and a second light emitting diode chip disposed on the lead frame unit to be substantially parallel to each other.

The light emitting diode may further include a first wavelength converter and a second wavelength converter configured to emit light having a same wavelength as each other, the first wavelength converter may be disposed on the first light emitting diode chip to convert a wavelength of light emitted from the first light emitting diode chip to a first wavelength band, the second wavelength converter may be disposed on the second light emitting diode chip to convert a wavelength of light emitted from the second light emitting diode chip to a second wavelength band different from the first wavelength band.

A light transmission portion may be disposed on the first wavelength converter and the second wavelength converter, and the first wavelength converter and the second wavelength converter may have a thickness smaller than a thickness of the light transmission portion.

The first light emitting diode chip and the second light emitting diode chip may be configured to emit light having a same wavelength as each other.

The first conductive layer may include a first upper electrode electrically connected to the first light emitting diode chip, a second upper electrode electrically connected to the first light emitting diode chip, a third upper electrode electrically connected to the second light emitting diode chip, and a fourth upper electrode electrically connected to the second light emitting diode chip.

The first light emitting diode chip and the second light emitting diode chip may overlap at least a portion of the first conductive layer in a plan view.

The light source unit may include a first light emitting diode chip and a second light emitting diode chip, and the first light emitting diode chip and the second light emitting diode chip may be spaced apart from each other by a first interval when viewed from a top of the light source unit. At least one of the first light emitting diode chip and the second light emitting diode chip may be spaced apart from an edge of the light source unit by a light emitting diode chip margin when viewed from a top of the light source unit, and the first interval may be greater than the light emitting diode chip margin.

The light source unit may have substantially a rectangular shape with long sides and short sides when viewed in a top view, the first light emitting diode chip and one short side of the light source unit adjacent to the first light emitting diode chip may be spaced apart from each other by a second interval, and the second light emitting diode chip and the other short side of the light source unit adjacent to the second light emitting diode chip may be spaced apart from each other by a third interval. The first interval is greater than the second interval and the third interval.

A light emitting diode package according to another exemplary embodiment includes a lead frame unit, a light source unit disposed on the lead frame unit, an external frame disposed at one side portion of the lead frame unit, and a solder ball connecting the lead frame unit to the external frame, in which the lead frame unit includes a body portion having a first surface contacting the light source unit, a second surface opposite to the first surface, and a third surface connecting the first surface and the second surface, the body portion including at least one solder hole recessed from the second surface and the third surface, a first conductive layer disposed on the first surface of the body portion, a second conductive layer disposed on the second surface of the body portion, and a through hole disposed between the first conductive layer and the second conductive layer and penetrating the body portion.

A shape of the solder hole from the second surface may be different from a shape of the solder hole from the third surface.

The external frame may be disposed to face the third surface of the body portion, the light source unit may include at least one light emitting diode chip, and a direction to which light emitted from the light emitting diode chip travels is substantially perpendicular to a direction in which the external frame is coupled to the body portion.

The through hole may be defined to be substantially parallel to the external frame, and the through hole and the solder hole may be spaced apart from each other.

The solder paste may be disposed in a first area between the second conductive layer and the external frame and a second area outside the body portion, and the solder paste disposed in the second area may cover at least a portion of the second conductive layer.

The light emitting diode package may further include a solder insulating layer disposed on the second surface, in which the solder insulating layer may cover at least a portion of the second conductive layer disposed between the solder holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
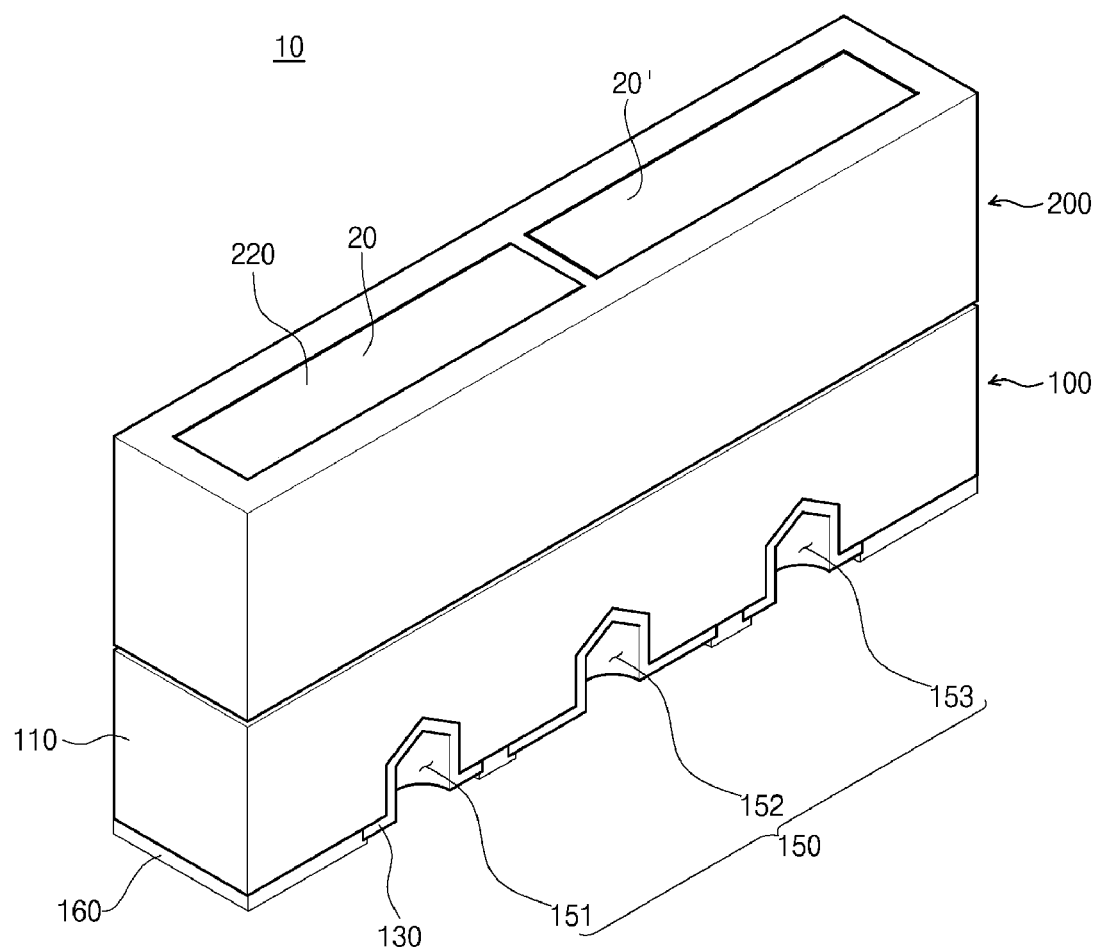
FIG. 1 is a perspective view of a light emitting diode according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be explained in detail with reference to the accompanying drawings.

FIG. 1 is a perspective view of a light emitting diode 10 according to an exemplary embodiment.

Referring to FIG. 1, the light emitting diode 10 includes a lead frame unit 100 and a light source unit 200 mounted on the lead frame unit 100.

The light source unit 200 is disposed on an upper surface of the lead frame unit 100, which provides a lead frame structure for connecting a light emitting diode chip included in the light source unit 200 to an external circuit. More particularly, the lead frame unit 100 is connected to first and second electrode pads of the light emitting diode chip included in the light source unit 200, and supplies a power necessary to emit light from the light source unit 200.

The light source unit 200 emits a light with a predetermined wavelength in response to the power applied thereto from the outside. For example, the light source unit 200 includes the light emitting diode chip, a transparent portion disposed on a front surface of the light emitting diode chip, and a housing surrounding the light emitting diode chip and the transparent portion, and emits light with the predetermined wavelength through the transparent portion. In some exemplary embodiments, the light source unit 200 may further include, for example, a wavelength converter that converts the wavelength of light emitted from the light emitting diode chip.

Figure 2A:
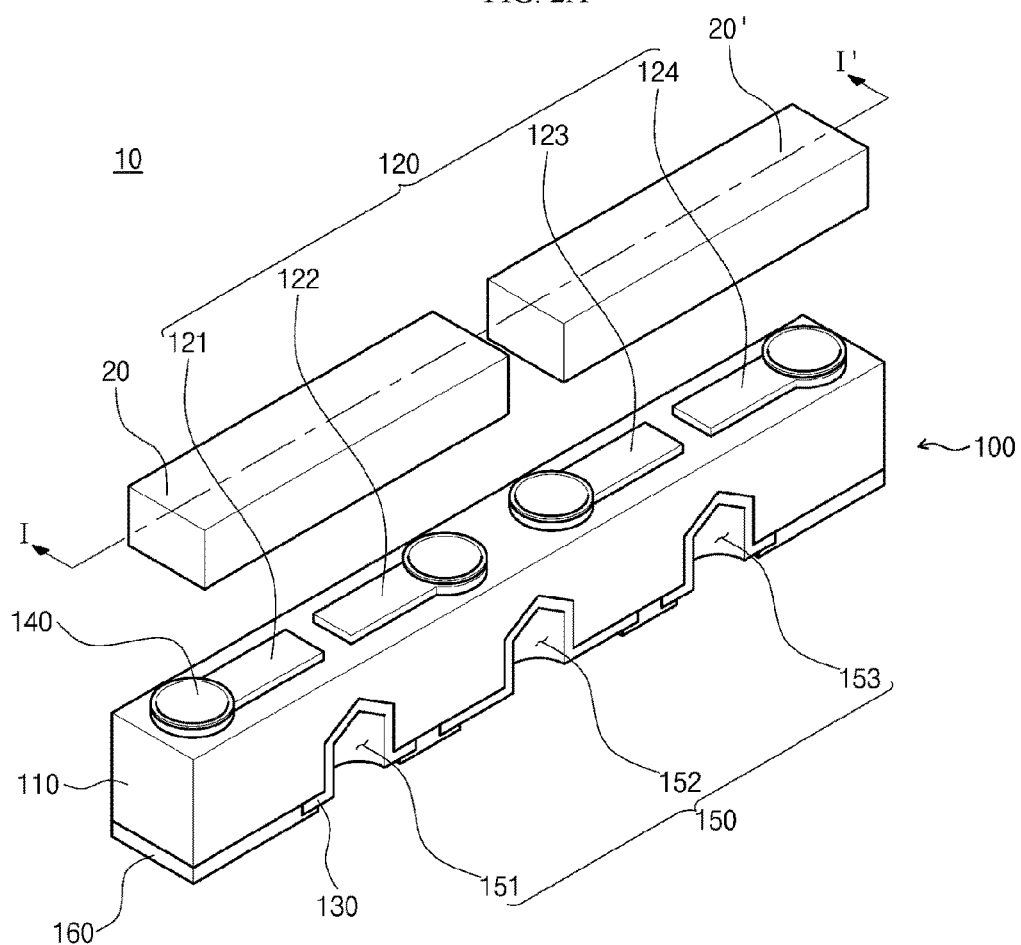
FIG. 2A is a perspective view of a light emitting diode according to an exemplary embodiment.
Figure 2B:
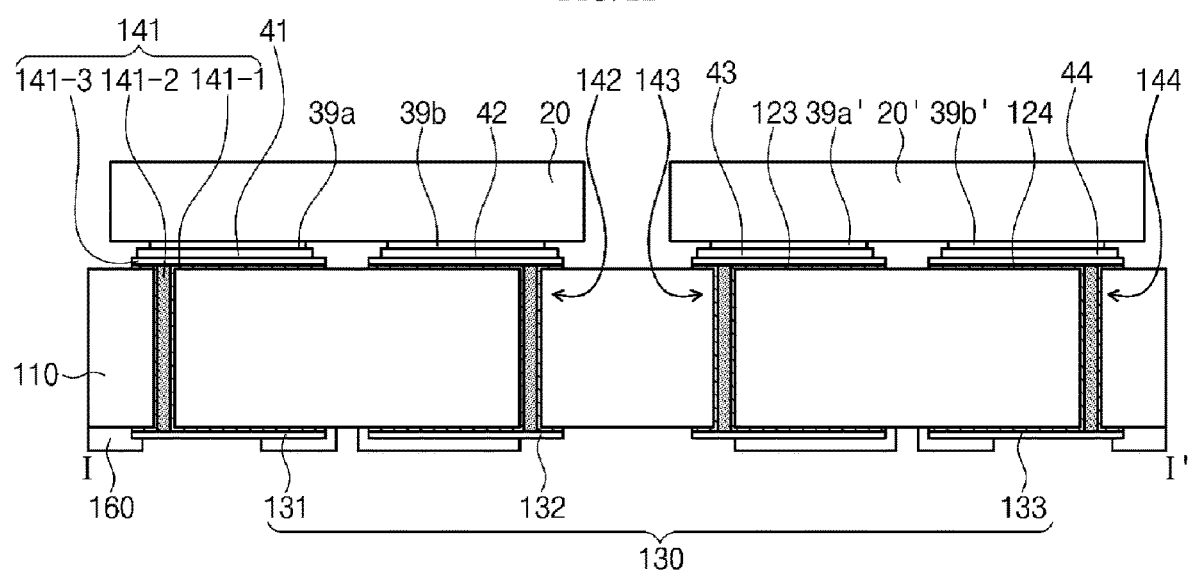
FIG. 2B is a cross-sectional view taken along line I-I' of FIG. 2A according to an exemplary embodiment.
Figure 2C:
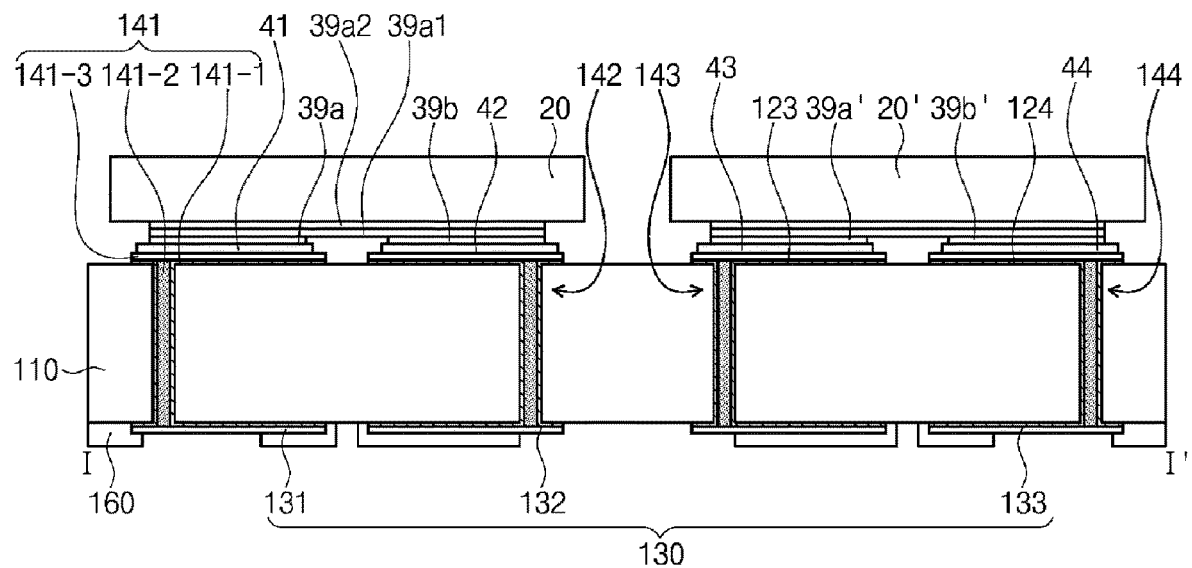
FIG. 2C is a cross-sectional view taken along line I-I' of FIG. 2A according to another exemplary embodiment.
Figure 2D:
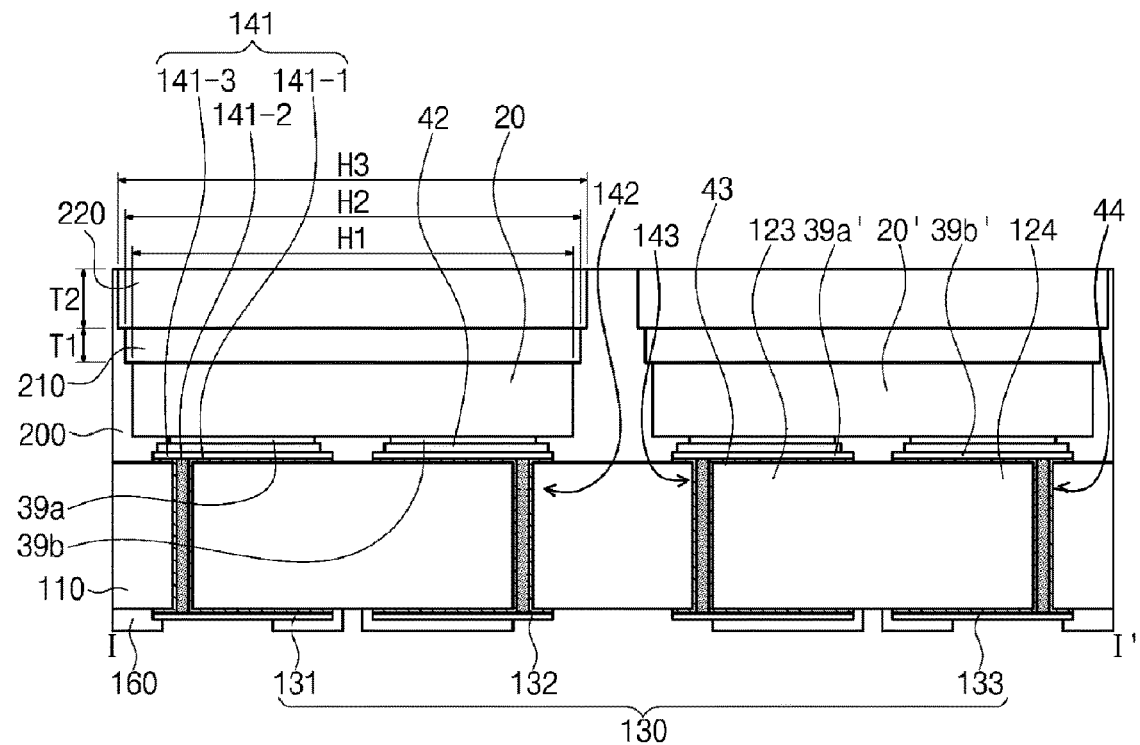
FIG. 2D is a cross-sectional view of a light emitting diode in which a lead frame unit and a light emitting unit are coupled to each other of FIG. 2A.

FIG. 2A is a perspective view of the light emitting diode according to an exemplary embodiment. FIG. 2B is a cross-sectional view taken along line I-I' of FIG. 2A according to an exemplary embodiment, and FIG. 2C is a cross-sectional view taken along line I-I' of FIG. 2A according to another exemplary embodiment. FIG. 2D is a cross-sectional view of a light emitting diode in which a lead frame unit and a light emitting unit are coupled to each other of FIG. 2A.

Referring to FIGS. 1, 2A, and 2B, the lead frame unit 100 includes a body portion 110, a first conductive layer 120, a second conductive layer 130, a connection portion 140, a solder hole 150, and a solder insulating layer 160.

The body portion 110 has an insulating property and serves as a base, on which the first conductive layer 120, the second conductive layer 130, the connection portion 140, and the solder hole 150 are provided.

The body portion 110 may be formed of a material having the insulating property. For example, the body portion 110 may include an organic polymer material. As the organic polymer material, at least one resin selected from an acrylic-based resin, a polyester-based resin, a polyurethane-based resin, an epoxy-based resin, a vinyl-based resin, a polystyrene-based resin, a polyamide-based resin, and a urea-based resin may be used. However, the inventive concepts are not limited thereto, as long as the material for the body portion 110 has an insulating property.

The body portion 110 may have a substantially rectangular parallelepiped shape. In particular, the body portion 110 may have a shape defined by a relatively long length and a relatively small height, and thickness to mount a plurality of light emitting diode chips 20 and 20'. However, the inventive concepts are not limited to on shape of the body portion 110, and in some exemplary embodiments, the body portion 110 may have various shapes other than the rectangular parallelepiped shape.

The body portion 110 may include a first surface, a second surface, and a third surface. The first surface of the body portion 110 may be a surface that makes contact with the light source unit 200, the second surface may be a surface that is opposite to the first surface, and the third surface may be a surface that connects the first surface and the second surface. As such, hereinafter, the first surface may be referred to as the upper surface of the body portion 110, the second surface may be referred to as the lower surface of the body portion 110, and the third surface may be referred to as the side surface of the body portion 110.

The first conductive layer 120 is disposed on the upper surface of the body portion 110 and electrically connected to the light emitting diode chips 20 and 20'. In particular, the first conductive layer 120 may be electrically connected to pad portions 39a, 39b, 39a', and 39b' of the light emitting diode chips 20 and 20'. The power may be supplied to the light emitting diode chips 20 and 20' via the first conductive layer 120.

The first conductive layer 120 may be formed of a material having a conductivity. For example, the first conductive layer 120 may include metal, such as Au, Pt, Pd, Rh, Ni, W, Mo, Cr, Ti, Fe, Cu, Al, Ag, In, and Sn, oxides thereof, and/or nitrides thereof. In addition, the first conductive layer 120 may have a single-layer or multi-layer structure.

The first conductive layer 120 may include a plurality of cathodes and anodes. For example, the first conductive layer 120 may include a first upper electrode 121, a second upper electrode 122, a third upper electrode 123, and a fourth upper electrode 124, and each of the first, second, third, and fourth upper electrodes 121, 122, 123, and 124 may serve as the cathode or the anode.

The first upper electrode 121, the second upper electrode 122, the third upper electrode 123, and the fourth upper electrode 124 may be disposed on the upper surface of the body portion 110 to be parallel to each other. In particular, the first conductive layer 120 may be provided such that the first upper electrode 121 and the fourth upper electrode 124 are disposed at outermost positions of the body portion 110, and the second upper electrode 122 and the third upper electrode 123 are disposed between the first upper electrode 121 and the fourth upper electrode 124.

When the first upper electrode 121 and the third upper electrode 123 serve as the cathode and the second upper electrode 122 and the fourth upper electrode 124 serve as the anode, a first electrode pad 39a of a first light emitting diode chip 20 connected to the first upper electrode 121 may be a p-type, and a second electrode pad 39b of the first light emitting diode chip 20 connected to the second upper electrode 122 may be an n-type. A first electrode pad 39a' of a second light emitting diode chip 20' may be the p-type, and a second electrode pad 39b' of the second light emitting diode chip 20' may be the n-type.

When the second upper electrode 122 and the fourth upper electrode 124 serve as the anode, a user may identify whether the first light emitting diode chip 20 and the second light emitting diode chip 20' disposed on the lead frame unit 100 are normally operated by substantially simultaneously applying signals to the first, second, third, and fourth upper electrodes 121, 122, 123, and 124. For example, a driving signal provided via a first lower electrode 131 is discharged to a third lower electrode 133 after sequentially passing through the first, second, third, and fourth upper electrodes 121, 122, 123, and 124. In this case, the user may identify whether the first light emitting diode chip 20 and the second light emitting diode chip 20' are normally operated.

In addition, different power may be applied to a pair of the first upper electrode 121 and the second upper electrode 122, and a pair of the third upper electrode 123 and the fourth upper electrode 124. In this manner, the first light emitting diode chip 20 and the second light emitting diode chip 20' may be independently operated. For example, the first light emitting diode chip 20 and the second light emitting diode chip 20' may be independently operated by respectively connecting an anode and a cathode of a first external power source to the first upper electrode 121 and the second upper electrode 122, respectively connecting an anode and a cathode of a second external power source to the third upper electrode 123 and the fourth upper electrode 124, and controlling on/off of the first external power source and the second external power source.

However, the inventive concepts are not limited to a particular arrangement of the first upper electrode 121, the second upper electrode 122, the third upper electrode 123, and the fourth upper electrode 124, and the arrangement thereof may be various modified.

The first, second, third, and fourth upper electrodes 121, 122, 123, and 124 may be arranged to be spaced apart from each other to prevent the first, second, third, and fourth upper electrodes 121, 122, 123, and 124 from being short-circuited with each other.

The first conductive layer 120 may include a cover plate and a bump. For example, the first upper electrode 121 may include a first cover plate 141_3 and a first bump 41. However, in some exemplary embodiments, the first bump 41 may be omitted. In this case, the first cover plate 141_3 may form the first upper electrode 121.

The bumps may be formed in the first, second, third, and fourth upper electrodes 121, 122, 123, and 124, and in particular, first, second, third, and fourth bumps 41, 42, 43, and 44 may be respectively included in the first, second, third, and fourth upper electrodes 121, 122, 123, and 124.

The first, second, third, and fourth bumps 41, 42, 43, and 44 are disposed between the first and second light emitting diode chips 20 and 20' and the body portion 110 to assist electrical connection between the first and second light emitting diode chips 20 and 20' and the body portion 110. The first, second, third, and fourth bumps 41, 42, 43, and 44 may be formed of a conductive paste. For example, the first, second, third, and fourth bumps 41, 42, 43, and 44 may include metal, such as Cu, AuSn, Al, Au, and Ag.

The second conductive layer 130 is disposed on the lower surface of the body portion 110 and electrically connected to an electrode of an external frame. As described above, the second surface or the lower surface of the body portion 110 may be a surface opposite to the first surface or the upper surface of the body portion 110, on which the first conductive layer 120 is disposed.

The second conductive layer 130 is disposed above at least a portion of the solder hole 150 defined in the body portion 110. Accordingly, the second conductive layer 130 has a shape that covers a portion of the lower surface of the body portion 110 and the solder hole 150.

The second conductive layer 130 may be formed of a material having a conductivity. For example, the second conductive layer 130 may include metal, such as Au, Pt, Pd, Rh, Ni, W, Mo, Cr, Ti, Fe, Cu, Al, Ag, In, and Sn, oxides thereof, and/or nitrides thereof. In addition, the second conductive layer 130 may have a single-layer or multi-layer structure.

The second conductive layer 130 may include Cu, Ni, and Au sequentially stacked one on another. In this case, Au may be disposed at an outermost position, and Cu may be disposed at an innermost position. When the second conductive layer 130 includes Cu, Ni, and Au, the second conductive layer 130 may be formed by an electroless plating method. In this case, Cu in the second conductive layer 130 may enhance electrical conductivity, and Au in the second conductive layer 130 may increase a bonding force or a solderability between the solder paste, which is provided on the second conductive layer 130. In addition, Ni provided between Cu and Au may serve as a barrier metal that prevents Au from being diffused into Cu.

Since the second conductive layer 130 has the multi-layer structure of Cu, Ni, and Au, the electrical conductivity and the bonding force with the solder paste may be improved.

The second conductive layer 130 may include a plurality of conductive patterns spaced apart from each other. For example, the second conductive layer 130 may include the first lower electrode 131, a second lower electrode 132, and the third lower electrode 133.

The first lower electrode 131, the second lower electrode 132, and the third lower electrode 133 may be disposed on the lower surface of the body portion 110 to be parallel to each other. In addition, the first lower electrode 131, the second lower electrode 132, and the third lower electrode 133 may be spaced apart from each other by a predetermined distance to prevent the first lower electrode 131, the second lower electrode 132, and the third lower electrode 133 from being short-circuited with each other.

In addition, the second lower electrode 132 may be provided as two portions spaced apart from each other or as a single portion. When the second lower electrode 132 is provided as two portions spaced apart from each other, the two portions may be connected to a second connection portion 142 and a third connection portion 143, respectively.

The first lower electrode 131, the second lower electrode 132, and the third lower electrode 133 may be disposed to overlap with the first upper electrode 121, the second upper electrode 122, the third upper electrode 123, and the fourth upper electrode 124 when viewed in a plan view. For example, the first lower electrode 131 may be disposed to overlap with the first upper electrode 121 when viewed in a plan view, the third lower electrode 133 may be disposed to overlap with the fourth upper electrode 124 when viewed in a plan view, and the second lower electrode 132 may be disposed to overlap with the second and third upper electrodes 122 and 123 when viewed in a plan view.

The first lower electrode 131, the second lower electrode 132, and the third lower electrode 133 may perform different functions from each other on the lead frame unit 100. For example, the first lower electrode 131 may serve as the cathode, and the third lower electrode 133 may serve as the anode. The second lower electrode 132 may be provided as two portions spaced apart from each other, and the portion closer to the first lower electrode 131 may serve as the anode, and the portion closer to the third lower electrode 133 may serve as the cathode.

According to another exemplary embodiment, the first lower electrode 131 and the third lower electrode 133 may serve as the cathode, and the second lower electrode 132 provided as a single portion may serve as the anode.

The connection portion 140 is disposed between the first conductive layer 120 and the second conductive layer 130 and penetrates through the body portion 110. The connection portion 140 has a conductivity. Therefore, the first conductive layer 120 and the second conductive layer 130 may be electrically connected to each other by the connection portion 140.

The connection portion 140 penetrates the body portion 110 in a height direction. In particular, the connection portion 140 penetrates the body portion 110 in a direction substantially perpendicular to the upper or lower surface of the body portion 110.

At least a portion of the connection portion 140 may be disposed above a through hole defined through the body portion 110, and a portion of the connection portion 140 may have a shape determined by the shape of the through hole.

The connection portion 140 may be provided in a plural number. The connection portion 140 may include a first connection portion 141, the second connection portion 142, the third connection portion 143, and a fourth connection portion 144. The first, second, third, and fourth connection portions 141, 142, 143, and 144 may be connected to the first conductive layer 120 and the second conductive layer 130. For example, the first connection portion 141 may connect the first upper electrode 121 of the first conductive layer 120 to the first lower electrode 131 of the second conductive layer 130. The second and third connection portions 142 and 143 may connect the second and third upper electrodes 122 and 123 to the second lower electrode 132. The fourth connection portion 144 may connect the fourth upper electrode 124 to the third lower electrode 133.

As the connection portion 140 connects the electrodes disposed on the upper and lower surfaces of the body portion 110, the driving signal and the power from the outside may be applied to the light emitting diode chips 20 and 20' through the second conductive layer 130, the connection portion 140, and the first conductive layer 120. In particular, since one second lower electrode 132 is connected to two upper electrodes 122 and 123, the same driving signal and power may be applied to the two upper electrodes 122 and 123. More particularly, the first light emitting diode chip 20 mounted on the second upper electrode 122 and the second light emitting diode chip 20' mounted on the third upper electrode 123 may be connected to each other in series.

The connection portion 140 may be provided in a VIA plug form. For example, with reference to the first connection 141, the first connection portion 141 may include a connection portion conductive layer 141_1, a plug 141_2, and a cover plate 141_3.

The connection portion conductive layer 141_1 may disposed on a surface that defines the through hole penetrating through the body portion 110. For example, the connection portion conductive layer 141_1 may be a thin conductive layer covering the surface that defines the through hole. Accordingly, the connection portion conductive layer 141_1 may include a conductive material. As the conductive material, metal, such as Au, Pt, Pd, Rh, Ni, W, Mo, Cr, Ti, Fe, Cu, Al, Ag, In, and Sn, oxides thereof, and/or nitrides thereof may be used. The connection portion conductive layer 141_1 may be formed on the surface that defines the through hole by plating the metal described above.

The connection portion conductive layer 141_1 is electrically connected to the first conductive layer 120 on the upper surface of the body portion 110 and electrically connected to the second conductive layer 130 on the lower surface of the body portion 110.

The plug 141_2 may be formed by filling an electrically conductive material or an electrically nonconductive material in the through hole and on the connection portion conductive layer 141_1. Accordingly, the shape of the plug 141_2 may be changed depending on the shape of the through hole and the connection portion conductive layer 141_1. For example, when the through hole has a cylindrical shape, the plug 141_2 filled in the through hole may also have a substantially cylindrical shape.

In an exemplary embodiment, the plug 141_2 may fill the through hole tightly. As the plug 141_2 fills the through hole, a structural stability of the connection portion 140 may be improved.

For example, the connection portion conductive layer 141_1 having a thin film shape may be broken by a distortion of the body portion 110 or an external impact. However, since the plug 141_2 provided with the connection portion conductive layer 141_1 buffers the distortion of the body portion 110 or the external impact, the connection portion conductive layer 141_1 may be protected therefrom. As such, the structural stability of the connection portion 140 may be improved.

The plug 141_2 may be formed of the electrically conductive material or the electrically nonconductive material. The electrically conductive material may be a Cu paste, and the electrically nonconductive material may be an epoxy resin. When the plug 141_2 is formed using the Cu paste, the plug 141_2 may serve as a heat exhaust port through which heat generated from the light source unit escapes.

The cover plate 141_3 is disposed above the upper surface and/or the lower surface of the body portion 110 to cover the through hole. The cover plate 141_3 may reinforce the electrical connection and the mechanical connection between the connection portion 140 and the first and second conductive layers 120 and 130. In detail, the cover plate 141_3 is provided to cover an upper surface and/or a lower surface of the connection portion conductive layer 141_1 and prevents the connection portion conductive layer 141_1 from being disconnected from the first conductive layer 120 or the second conductive layer 130.

The cover plate 141_3 may overlap with the connection portion conductive layer 141_1 when viewed in a plan view. In detail, since the cover plate 141_3 is provided to cover the connection portion conductive layer 141_1, the connection portion conductive layer 141_1 may not be exposed on the upper surface or the lower surface of the body portion 110. In this case, the cover plate 141_3 may have substantially the same shape as the connection portion conductive layer 141_1 on the upper surface and the lower surface of the body portion 110.

The solder hole 150 may have a shape recessed from the lower surface of the body portion 110 by removing a portion of the lower surface of the body portion 110. In detail, the solder hole 150 may have a shape, in which a portion of the lower surface is removed to a predetermined depth, and thus, the solder hole 150 formed over the second surface (or the bottom surface) and the third surface (or the side surface) of the body portion 110 may be provided.

The solder hole 150 may have different shapes when viewed from the second and third sides of the body portion 110. For example, the solder hole 150 may have a semi-circular shape or a semi-elliptical shape when viewed from the second side of the body portion 110. In addition, the solder hole 150 may have a pentagonal shape when viewed on the third side of the body portion 110. Detailed descriptions of the shape of the solder hole 150 will be described later.

The solder hole 150 allows the light emitting diode 10 to be connected to an external frame. In detail, the light emitting diode 10 and the external frame may be connected to each other by the solder paste provided in the solder hole 150.

The solder hole 150 may be provided in a plural number. According to an exemplary embodiment, for example, the solder hole 150 may include a first solder hole 151, a second solder hole 152, and a third solder hole 153. The first, second, and third solder holes 151, 152, and 153 may be provided to be spaced apart from each other. In addition, the first, second, and third solder holes 151, 152, and 153 may have the same or different shapes.

The solder hole 150 may be spaced apart from the through hole. Accordingly, an unnecessary connection between the solder hole 150 and the through hole may be prevented from occurring.

The second conductive layer 130 may be provided in the solder hole 150. Accordingly, when the solder paste is provided in the solder hole 150, the second conductive layer 130 and the solder paste may be connected to each other. The second conductive layer 130 provided in the solder hole 150 may be connected to at least one of the first lower electrode 131, the second lower electrode 132, and the third lower electrode 133.

According to an exemplary embodiment, since the first, second, third solder holes 151, 152, and 153 are provided in the light emitting diode 10, a stable electrical and mechanical connection may be established between the light emitting diode 10 and the external frame. In particular, the solder hole 150 according to an exemplary embodiment may have the semi-circular or semi-elliptical shape when viewed on the lower surface of the body portion 110, and may have the pentagonal shape when viewed on the side surface of the body portion 110, and thus, the light emitting diode 10 and the external frame may be more stably connected to each other. The shape of the solder hole 150 will be described in detail later.

The solder insulating layer 160 is formed on the lower surface of the body portion 110.

The solder insulating layer 160 is disposed between the first, second, and third solder holes 151, 152, and 153 to prevent a short circuit between the second conductive layer 130 and/or the solder paste provided in the first, second, and third solder holes 151, 152 and 153. The solder insulating layer 160 may have various shapes. The shape of the solder insulating layer 160 will be described in detail later.

In some exemplary embodiments, the solder insulating layer 160 may be omitted when the light source unit includes the first light emitting diode chip 20 and the second light emitting diode chip 20'.

The light source unit 200 may include a light transmission portion 220 and the first and second light emitting diode chips 20 and 20'. The first and second light emitting diode chips 20 and 20' may emit lights having the same wavelength or different wavelengths. For example, the first and second light emitting diode chips 20 and 20' may emit lights having the wavelength of about 449 nm. As another example, the first and second light emitting diode chips 20 and 20' may emit lights having the wavelengths of about 448 nm and about 450 nm, respectively, or lights having the wavelengths of about 447 nm and about 451 nm, respectively. Although the first and second light emitting diode chips 20 and 20' emit lights having different wavelengths from each other, the light source unit 200 may be manufactured such that an average wavelength of lights emitted from the first light emitting diode chip 20 and the second light emitting diode chip 20' is about 449 nm. However, the inventive concepts are not limited thereto, and in some exemplary embodiments, each of the first light emitting diode chip 20 and the second light emitting diode chip 20' may emit light having a wavelength different from the wavelength of about 449 nm.

The first light emitting diode chip 20 and the second light emitting diode chip 20' may be substantially simultaneously operated or independently operated.

The first light emitting diode chip 20 includes the first electrode pad 39a and the second electrode pad 39b. The second light emitting diode chip 20' includes two electrode pads 39a' and 39b'. In the first light emitting diode chip 20, the first electrode pad 39a is electrically connected to the first upper electrode 121, and the second electrode pad 39b is electrically connected to the second upper electrode 122. Accordingly, the electrical signal may be applied to the first light emitting diode chip 20 via the first electrode pad 39a and the second electrode pad 39b.

The first, second, third, and fourth upper electrodes 121, 122, 123, and 124 may function differently depending on the connection form with the external power source. For example, the first upper electrode 121 and the fourth upper electrode 124 may serve as the cathode, and the second upper electrode 122 and the third upper electrode 123 may serve as the anode. In some exemplary embodiments, the first upper electrode 121 and the third upper electrode 123 may serve as the cathode, and the second upper electrode 122 and the fourth upper electrode 124 may serve as the anode.

The first electrode pad 39a and the second electrode pad 39b may be disposed to overlap with the first upper electrode 121 and the second upper electrode 122, respectively, when viewed in a plan view. In addition, the first electrode pad 39a and the second electrode pad 39b may have a size greater than, smaller than, or equal to a size of the first upper electrode 121 and the second upper electrode 122. Since the above-mentioned components overlap with each other when viewed in a plan view, and the first upper electrode 121 and the second upper electrode 122 have a relatively large surface area, the first light emitting diode chip 20 may be easily mounted on the lead frame unit 100.

Referring to FIG. 2C, a first bump conductive layer and a second bump conductive layer may be further disposed above the first bump 41. The first bump conductive layer and the second bump conductive layer may be sequentially stacked above the first bump 41. The first bump conductive layer and the second bump conductive layer may assist the electrical connection and the mechanical connection between the first upper electrode 121 and the first electrode pad 39a. More particularly, the first bump conductive layer may cover a side surface of the first bump 41, thereby rendering the electrical connection and the mechanical connection more stable. According to an exemplary embodiment, the first bump conductive layer may include nickel (Ni), and the second bump conductive layer may include gold (Au).

Referring to FIG. 2D, the light source unit 200 may include the first light emitting diode chip 20, the second light source diode chip 20', the wavelength converter 210, and the light transmission portion 220.

The wavelength converter 210 may be disposed on the first light emitting diode chip 20 and the second light source diode chip 20' and may convert the wavelength of the light emitted from the first light emitting diode chip 20 and the second light source diode chip 20' to a specific wavelength band.

The wavelength converter 210 may include a fluorescent material to perform the above function of converting the wavelength band. The fluorescent material included in the wavelength converter 210 may absorb the light emitted from the first light emitting diode chip 20 and the second light emitting diode chip 20' and may emit a light having a wavelength band different from the absorbed light.

The fluorescent material included in the wavelength converter 210 may be, but not limited to, a fluorine-based fluorescent material. When the wavelength converter 210 includes the fluorine-based fluorescent material, a wavelength conversion efficiency may be superior, but the fluorescent material may be vulnerable to moisture. Since the light emitting diode according to an exemplary embodiment of the present disclosure has a structure that prevents the moisture from entering the wavelength converter 210, there is no risk of deterioration of the fluorescent material by moisture while using a highly efficient fluorescent material. The structure of the wavelength converter 210 that performs the above-described function will be described in detail hereinbelow.

The wavelength converter 210 may include a plurality of layers spaced apart from each other. For example, the wavelength converter 210 disposed on the first light emitting diode chip 20 and the wavelength converter 210 disposed on the second light emitting diode chip 20' may be different types from each other. As an example, a first wavelength converter is disposed on the first light emitting diode chip 20, a second wavelength converter is disposed on the second light emitting diode chip 20', and the first wavelength converter and the second wavelength converter may be different types from each other. Accordingly, although the first light emitting diode chip 20 and the second light emitting diode chip 20' emit the lights having the same wavelength, the lights emitted from the light transmission portion 220 after passing through the wavelength converter 210 may have different wavelengths from each other. For example, when the first light emitting diode chip 20 and the second light emitting diode chip 20' emit a white light, light exiting from an area provided with the first light emitting diode chip 20 may be light having a blue wavelength band, and light exiting from an area provided with the second light emitting diode chip 20' may be light having a red wavelength band.

The light transmission portion 220 transmits lights emitted from the first light emitting diode chip 20 and the second light emitting diode chip 20' to the outside. Therefore, the light transmission portion 220 may be optically transparent. The light transmission portion 220 may perform a protective function to prevent the first light emitting diode chip 20 and the second light emitting diode chip 20' from being damaged by external impact or moisture.

The light transmission portion 220 may include a partition wall disposed between the first light emitting diode chip 20 and the second light emitting diode chip 20'. The partition wall may prevent a color mixture of light emitted from the first light emitting diode chip 20 and the second light emitting diode chip 20'.

According to an exemplary embodiment, the wavelength converter 210 has a wavelength converter thickness T1 in a cross-section, and the light transmission portion 220 has a light transmission portion thickness T2. In this case, the wavelength converter thickness T1 may be smaller than the light transmission portion thickness T2. The wavelength converter 210 may be configured to have a relatively high density of the fluorescent material, and thus the wavelength conversion may sufficiently occur even when the wavelength converter 210 having a relatively small thickness is used. Therefore, the wavelength conversion may be sufficiently performed even though the wavelength converter thickness T1 is smaller than the light transmission portion thickness T2. Since the wavelength converter thickness T1 is smaller than the light transmission portion thickness T2, the light emitting diode may be slim.

When viewed in a plan view, the first light emitting diode chip 20 has a light emitting diode chip width H1, the wavelength converter 210 has a wavelength converter width H2, and the light transmission portion 220 has a light transmission portion width H3. The light emitting diode chip width H1 may be smaller than the wavelength converter width H2, and the wavelength converter width H2 may be smaller than the light transmission portion width H3. Thus, when viewed from a cross-section, the first light emitting diode chip 20, the wavelength converter 210, and the light transmission portion 220 may be sequentially stacked in a stepped shape.

As the light transmission portion width H3 is greater than the wavelength converter width H2 in the light source unit 200, moisture may be prevented from entering the wavelength converter 210 along an edge of the light transmission portion 220. In addition, since the light transmission portion thickness T2 is relatively large, moisture may be prevented from entering the wavelength converter 210 after passing through the light transmission portion 220. Accordingly, although the density of the fluorescent material in the wavelength converter 210 is high, there is no risk of deformation and deterioration of the fluorescent material by moisture.

Since the wavelength converter width H2 is greater than the light emitting diode chip width H1 in the light source unit 200, the light emitted from the first light emitting diode chip 20 and/or the second light emitting diode chip 20' may be incident into the wavelength converter 210 without loss. Therefore, the light efficiency of the light emitting diode is superior because no light is lost.

According to an exemplary embodiment, since the light transmission portion width H3 is greater than the wavelength converter width H2 in the light source unit 200, a high efficiency wavelength converter 210 having the high fluorescent material density may be used, and thus the wavelength converter thickness T1 may become relatively thin. Accordingly, the light emitting diode according to the exemplary embodiment may be slim with excellent light efficiency.

Hereinafter, the first conductive layer 120 and the second conductive layer 130 provided on the upper and lower surfaces of the body portion 110 will be more described in detail.

FIGS. 3A to 3E are plan views showing a first surface and a second surface of a lead frame unit according to exemplary embodiments.

Figure 3A:
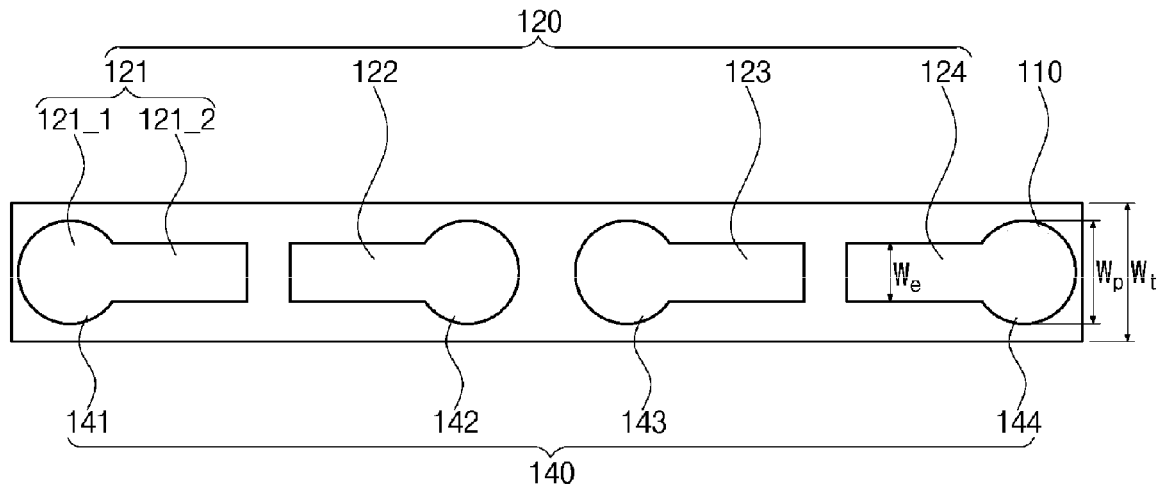
FIGS. 3A, 3B, 3C, 3D, and 3E are plan views of a first surface and a second surface of a lead frame unit according to exemplary embodiments.

Referring to FIG. 3A, the first conductive layer 120 is disposed on the first surface (or the upper surface) of the body portion 110. The first conductive layer 120 may include a plurality of patterns spaced apart from each other. For example, the first conductive layer 120 may include the first upper electrode 121, the second upper electrode 122, the third upper electrode 123, and the fourth upper electrode 124.

Hereinafter, the structure and functions of the first conductive layer 120 according to an exemplary embodiment will be described with reference to the first upper electrode 121. It is noted that, however, the structures and functions of the first upper electrode 121 may be applied to the second upper electrode 122, the third upper electrode 123, and the fourth upper electrode 124.

The first upper electrode 121 includes a circular portion 121_1 and an elongated portion 121_2.

The circular portion 121_1 has a substantially circular shape and is provided integrally with the elongated portion 121_2. As shown in FIG. 3A, the circular portion 121_1 has a diameter Wp greater than a width We of the elongated portion 121_2. Since the diameter Wp of the circular portion 121_1 is greater than the width We of the elongated portion 121_2, the through hole may be easily formed in the circular portion 121_1.

The circular portion 121_1 and the connection portion 140 may be disposed to overlap with each other when viewed in a plan view. Accordingly, a position of the circular portion 121_1 may be determined depending on a position of the connection portion 140. For example, as shown in FIG. 3A, the circular portions of the first and second upper electrodes 121 and 122 are disposed to be spaced apart from each other with the elongated portions of the first and second upper electrodes 121 and 122 interposed therebetween, and the circular portions of the second and third upper electrodes 122 and 123 are disposed to be closer to each other without the elongated portions of the second and third upper electrodes 122 and 123 interposed therebetween.

In more detail, the circular portions is disposed as shown in FIG. 3A because the second and third upper electrodes 122 and 123 share one second lower electrode 132. The second connection portion 142 and the third connection portion 143 are required to overlap with the second lower electrode 132 when viewed in a plan view to connect the second and third upper electrodes 122 and 123 to the second lower electrode 132. To this end, the second connection portion 142 and the third connection portion 143 are positioned close to each other, and the circular portions corresponding to the second connection portion 142 and the third connection portion 143 are also positioned close to each other. However, the inventive concepts are not limited thereto, and the positions of the circular portions may be changed depending on the arrangement of the anode and cathode.

The elongated portion 121_2 is disposed at one side of the circular portion 121_1 and formed integrally with the circular portion 121_1. The elongated portion 121_2 connects the light emitting diode chip disposed on the first conductive layer 120 to the first conductive layer 120. In detail, the pad portion disposed under the light emitting diode chip may be placed on the elongated portion 121_2 of the first conductive layer 120. Accordingly, the driving signal and the power may be applied to the light emitting diode chip via the elongated portion 121_2.

The elongated portion 121_2 has the width We smaller than that of the circular portion 121_1 but has a length longer than that of the circular portion 121_1. In detail, the elongated portion 121_2 may have a shape elongated substantially parallel to a longitudinal direction of the upper surface of the body portion 110. Since the elongated portion 121_2 has a shape elongated substantially parallel to the longitudinal direction, the pad portion of the light emitting diode chip may be easily placed on the elongated portion 121_2. That is, since an area of the elongated portion 121_2, which makes contact with the pad portion of the light emitting diode chip, is wide, the light emitting diode chip may be easily mounted on the elongated portion 121_2.

The circular portion 121_1 and the elongated portion 121_2 may be disposed in the body portion 110 when viewed in a plan view. Accordingly, when the light emitting diode is viewed from the side surface, the elongated portion 121_2 and the circular portion 121_1 may not be exposed to the outside. The diameter Wp of the circular portion 121_1 may be smaller than the thickness Wt of the body portion 110 so as not to expose the elongated portion 121_2 and the circular portion 121_1 at the side surface of the body portion 110.

For example, the diameter Wp of the circular portion 121_1 may be within a range from about 30% to about 60% of the thickness Wt of the body portion 110. When the circular portion 121_1 has the diameter Wp described above, the through hole may be more easily formed, and the circular portion 121_1 may not be exposed at the side surface of the body portion 110. In addition, since the first upper electrode 121 is not exposed at the side surface of the body portion 110, the first upper electrode 121 may be prevented from being oxidized by external oxygen and moisture. Further, the moisture may be prevented from entering the lead frame unit 100 along the first upper electrode 121, and the exposed first upper electrode 121 and other components may be prevented from being short-circuited with each other.

A thickness We of the elongated portion 121_2 may be within a range from about 30% to about 60% of the thickness Wt of the body portion 110. Since the thickness We of the elongated portion 121_2 is relatively smaller than the thickness Wt of the body portion 110, the elongated portion 121_2 may be stick out from the body portion 110. Thus, the elongated portion 121_2 may be prevented from being short-circuited with other components.

The width We of the elongated portion 121_2 may be smaller than the diameter Wp of the circular portion 121_1. Accordingly, a via hole may be stably formed in the circular portion 121_1 having a relatively large diameter. However, in some exemplary embodiments, the width of the elongated portion 121_2 may be equal to the diameter of the circular portion 121_1. Various shapes of the circular portion 121_1 and the elongated portion 121_2 will be described in more detail later.

Figure 3B:
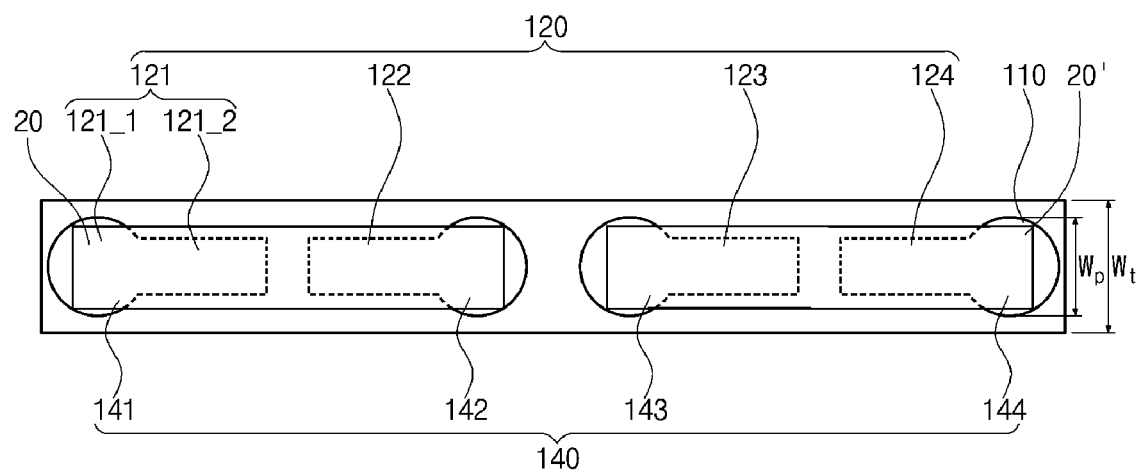
Figure 3C:
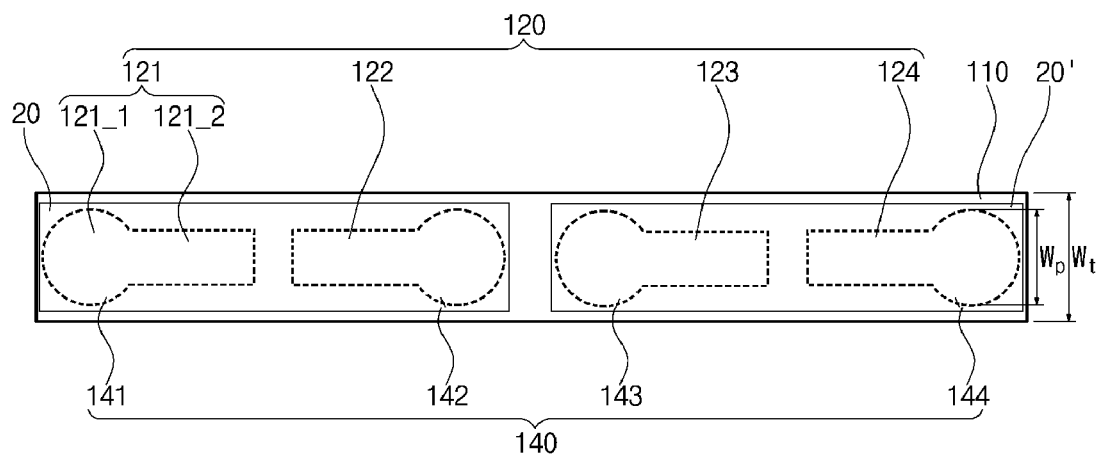

Referring to FIGS. 3B and 3C, the first light emitting diode chip 20 and the second light emitting diode chip 20' are mounted on the upper surface of the body portion 110.

In this case, the first light emitting diode chip 20 and the second light emitting diode chip 20' are disposed such that at least a portion of the first light emitting diode chip 20 and the second light emitting diode chip 20' overlaps with the first, second, third, and fourth upper electrodes 121, 122, 123, and 124 when viewed in a plan view.

According to FIG. 3B, the first light emitting diode chip 20 and the second light emitting diode chip 20' cover some portions of the first, second, third, and fourth upper electrodes 121, 122, 123, and 124 when viewed in a plan view, while exposing some portions of the first, second, third, and fourth upper electrodes 121, 122, 123, and 124 when viewed in a plan view. For example, as shown in figures, the elongated portions of the first, second, third, and fourth upper electrodes 121, 122, 123, and 124 may be covered by the first light emitting diode chip 20 and the second light emitting diode chip 20', however, some portions of the circular portions of the first, second, third, and fourth upper electrodes 121, 122, 123, and 124 may be exposed.

In this manner, the first light emitting diode chip 20 and the second light emitting diode chip 20' having relatively small sizes may be easily mounted on the first, second, third, and fourth upper electrodes 121, 122, 123, and 124, which occupy a relatively larger area.

Referring to FIG. 3C, according to another exemplary embodiment, the first light emitting diode chip 20 and the second light emitting diode chip 20' are disposed to completely cover the first, second, third, and fourth upper electrodes 121, 122, 123, and 124 when viewed in a plan view.

In this case, the areas at which the first light emitting diode chip 20 and the second light emitting diode chip 20' overlap the first, second, third, and fourth upper electrodes 121, 122, 123, and 124 may be increased. As such, the electrical connection between the components may be maintained more stably, and the heat dissipation efficiency may be improved.

Figure 3D:
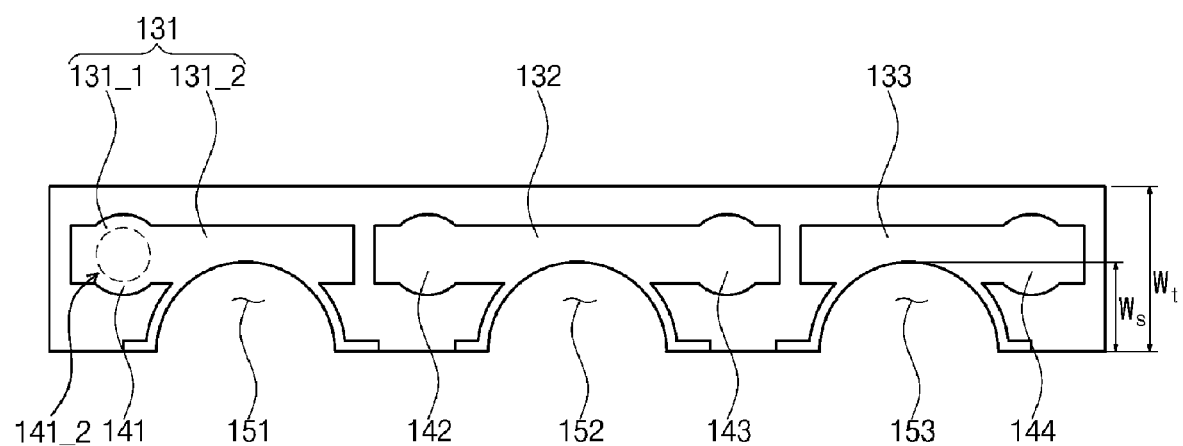
Figure 3E:
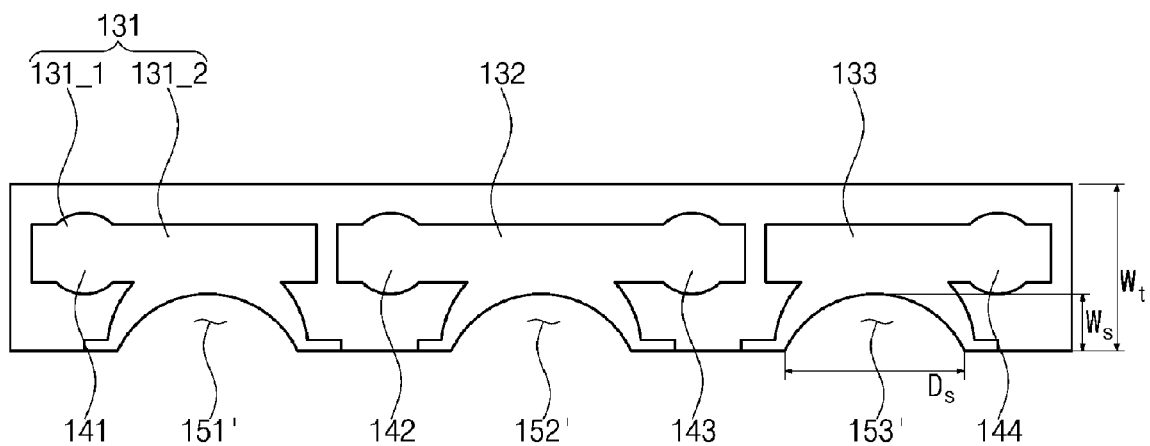

FIGS. 3D and 3E are plan views of the second surface of the lead frame unit according to exemplary embodiments.

Referring to FIG. 3D, the second conductive layer 130 is disposed on the second surface (or the lower surface) of the body portion 110. The second conductive layer 130 includes a plurality of patterns spaced apart from each other. For example, the second conductive layer 130 includes the first, second, and third lower electrodes 131, 132, and 133.

Hereinafter, the second conductive layer 130 according to an exemplary embodiment will be described with reference to the first lower electrode 131.

The first lower electrode 131 includes a lower circular portion 131_1 and a lower elongated portion 131_2.

The lower circular portion 131_1 and the lower elongated portion 131_2 of FIG. 3D are substantially similar to the circular portion 121_1 and the elongated portion 121_2 of the first conductive layer 120 of FIG. 3A, respectively. As such, the same or substantially similar components will be assigned with the same or similar reference numerals, and repeated or redundant descriptions thereof will be omitted.

The lower circular portion 131_1 has a substantially circular shape and is provided integrally with the lower elongated portion 131_2. The lower circular portion 131_1 has a diameter greater than a width of the lower elongated portion 131_2.

The lower circular portion 131_1 may be disposed to overlap with the circular portion 121_1 of the first conductive layer 120 when viewed in a plan view. Accordingly, the first connection portion 141 may be provided in a shape extending from the circular portion 121_1 to the lower circular portion 131_1.

The lower elongated portion 131_2 may be disposed at one side of the lower circular portion 131_1 and may surround the first solder hole 151. For example, the lower elongated portion 131_2 may be disposed along an edge of the first solder hole 151. Therefore, when the solder paste is provided in the first solder hole 151, the solder paste may be electrically connected to the lower elongated portion 131_2 disposed at the edge of the first solder hole 151.

The second lower electrode 132 may include two lower circular portions. The two lower circular portions are respectively connected to the second connection portion 142 and the third connection portion 143. Further, the two lower circular portions of the second lower electrode 132 may be connected to the circular portion of the second upper electrode 122 and the circular portion of the third upper electrode 123, respectively.

According to another exemplary embodiment, the second lower electrode 132 may be divided into two portions with respect to the second solder hole 152. Thus, the second connection portion 142 and the third connection portion 143 may be electrically independent from each other. Accordingly, in some implementations, an electricity may be applied only to the second connection portion 142 and the first connection portion 141, and the electricity may not be applied to the third connection portion 143 and the fourth connection portion 144.

The plug 141_2 of the first connection portion 141 and the first solder hole 151 may be separated from each other by a predetermined distance. For example, the plug 141_2 of the first connection portion 141 and the first solder hole 151 may be separated from each other by about 40 μm to about 50 μm. When the separation distance between the plug 141_2 of the first connection portion 141 and the first solder hole 151 is less than about 40 μm, the through hole may penetrate the first solder hole 151 due to a process error during the process of forming the through hole for the plug 141_2. In addition, when the separation distance between the plug 141_2 of the first connection portion 141 and the first solder hole 151 exceeds about 50 μm, the size of the lead frame unit 100 may be excessively large.

The second connection portion 142 and the third connection portion 143 may be disposed to be spaced apart from the second solder hole 152 by about 50 μm or more when viewed from the lower surface (or the second surface) of the body portion 110. When the second connection portion 142 and the third connection portion 143 are spaced apart from the second solder hole 152 by the above-described minimum distance, unintended electrical connections may be prevented from occurring.

The first, second, and third solder holes 151, 152, and 153 may have a semi-circular or semi-elliptical shape when viewed from the lower surface (or the second surface) of the body portion 110. In detail, the first, second, and third solder holes 151, 152, and 153 may have a shape recessed inward from the third surface of the body portion 110 when viewed from the second surface. For example, the semi-circular or semi-elliptical shape of the first, second, and third solder holes 151, 152, and 153 when viewed from the second surface may have a chord parallel to the third surface and a round arc inside the body portion 110.

The third solder hole 153 may have a solder hole height Ws, which is a depth of the third solder hole 153, in a range from about 10% to about 50% of the thickness Wt of the body portion 110. In more detail, when the solder hole height Ws is less than about 10% of the thickness Wt of the body portion 110, a crack may occur in the body portion 110 when external impacts are applied to the light emitting diode or the external frame, and the solder paste penetrates along the crack, thereby causing the short circuit. When the solder hole height Ws exceeds about 50% of the thickness Wt of the body portion 110, an excessive amount of the solder paste may be used considering a contact area of the solder paste, and thus, the light emitting diode may not be fixed to and may be separated from the external frame. As described above, since the solder hole height Ws is within the range from about 10% to about 50% of the thickness Wt of the body portion 110, the short circuit caused by the crack may be prevented, and the light emitting diode may be stably fixed to the external frame.

Referring to FIG. 3E, a second conductive layer 130' including first, second, and third lower electrodes 131', 132', and 133', and first, second, and third solder holes 151', 152', and 153' according to another exemplary embodiment have different shapes from those of the second conductive layer 130 and the first, second, and third solder holes 151, 152, and 153 shown in FIG. 3D.

In detail, each of the first, second, and third solder holes 151', 152', and 153' has a solder hole diameter Ds and a solder hole height Ws, and the solder hole diameter Ds may be at least two times or more than the solder hole height Ws. Accordingly, each of the first, second, and third solder holes 151', 152', and 153' may have a semi-elliptical shape.

As described above, since the first, second, and third solder holes 151', 152', and 153' are formed to have the relatively small solder hole height Ws, the area of the first, second, and third lower electrodes 131', 132', and 133' may be widened at the lower surface of the body portion. In this manner, the heat dissipation efficiency via the first, second, and third lower electrodes 131', 132', and 133' may be improved.

In addition, the second lower electrode 132' according to the illustrated exemplary embodiment may be provided as a single unitary form without being divided into two portions with respect to the second solder hole 152. When the second lower electrode 132' is provided in the single unitary form, the electricity applied to the second lower electrode 132' may be substantially simultaneously applied to the second connection portion 142 and the third connection portion 143.

FIGS. 4A to 4G are plan views showing the second surface of the lead frame unit according to exemplary embodiments.

Figure 4A:
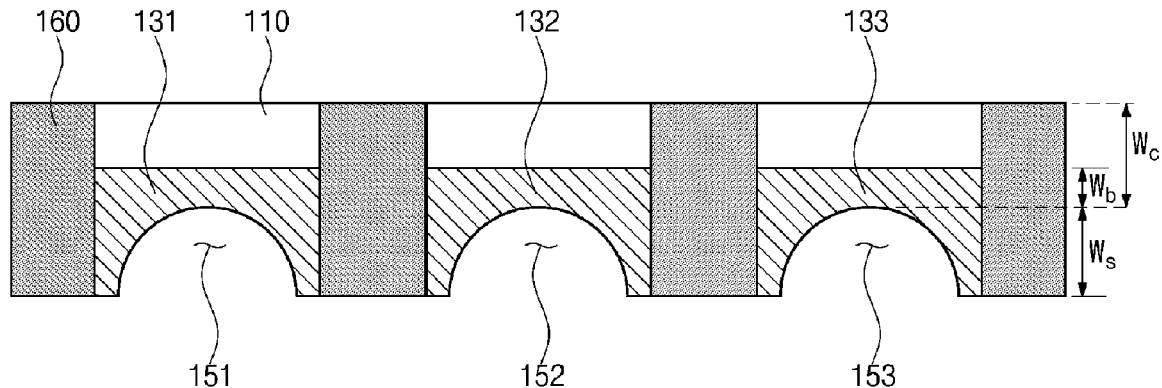
FIGS. 4A, 4B, 4C, 4D, 4E, 4F, and 4G are plan views of a second surface of a lead frame unit according to exemplary embodiments.
Figure 4B:
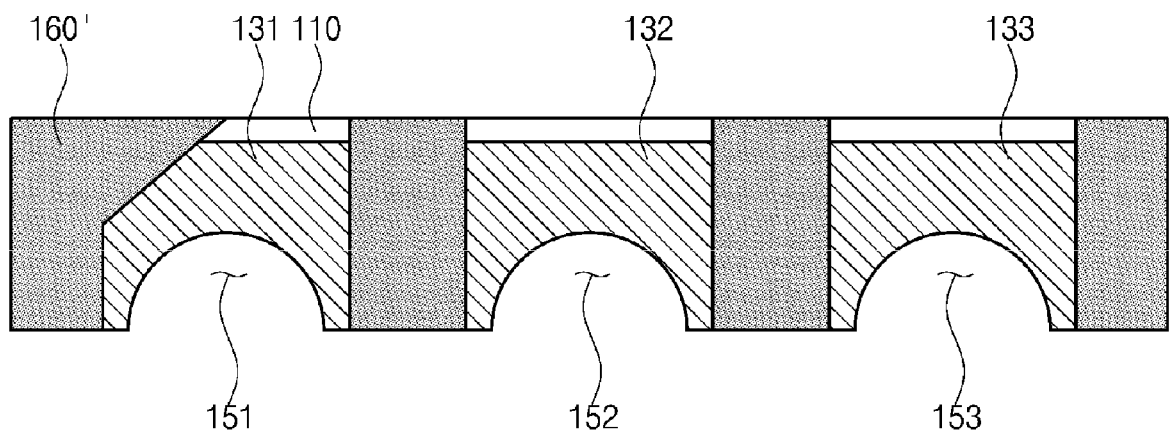
Figure 4C:
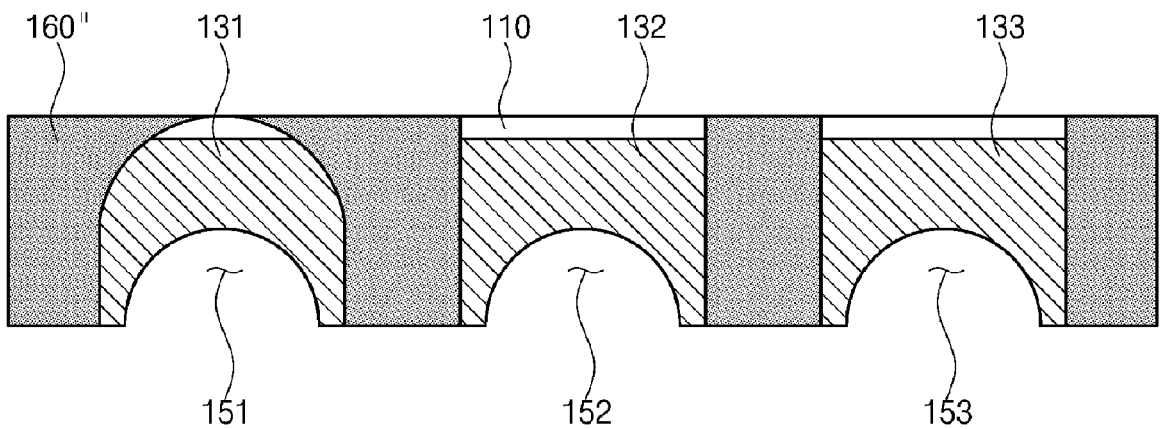
Figure 4D:
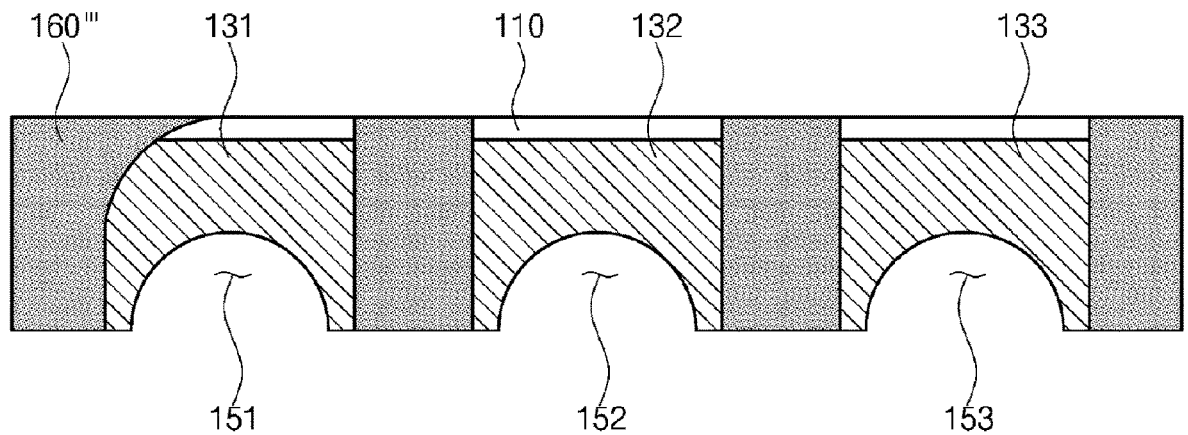
Figure 4E:
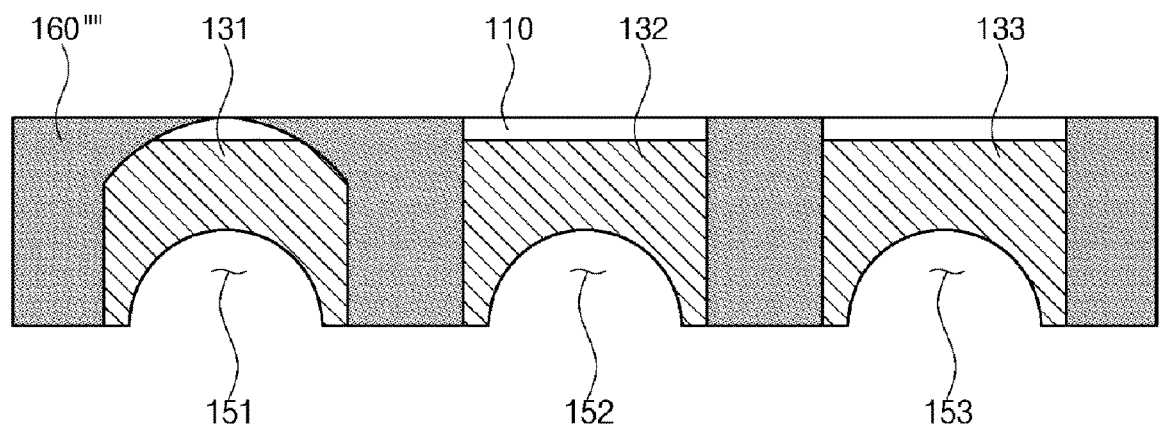

Referring to FIG. 4A, the first, second, and third solder holes 151, 152, and 153 and the solder insulating layer 160 are disposed on the second surface (or the lower surface) of the body portion 110.

The solder insulating layer 160 may be disposed between the first, second, and third solder holes 151, 152, and 153 to prevent the short circuit from occurring between the first, second, and third solder holes 151, 152, and 153. Accordingly, the solder insulating layer 160 may be disposed to surround peripheries of the first, second, and third solder holes 151, 152, and 153. For example, the solder insulating layer 160 may be disposed outside the first solder hole 151 and the third solder hole 153, and between the first, second, and third solder holes 151, 152, and 153.

The solder insulating layer 160 may be disposed to cover at least a portion of the second conductive layer formed between the first, second, and third solder holes 151, 152, and 153 on the second surface of the body portion 110. For example, the second conductive layer has the first, second, and third lower electrodes 131, 132, and 133 on the second surface of the body portion 110, and the first, second, and third lower electrodes 131, 132, and 133 may be disposed to surround the first, second, and third solder holes 151, 152, and 153, respectively. In this case, the solder insulating layer 160 may be disposed between the first, second, and third lower electrodes 131, 132, and 133 that surround the first, second, and third solder holes 151, 152, and 153, respectively. In detail, the solder insulating layer 160 may be disposed between the first lower electrode 131 surrounding the first solder hole 151 and the second lower electrode 132 surrounding the second solder hole 152, and between the second lower electrode 132 and the third lower electrode 133 surrounding the third solder hole 153. When the solder insulating layer 160 is provided in the above-described manner, the short circuit may not occur between the first, second, and third lower electrodes 131, 132, and 133 even when different electrical signals are applied to the first, second, and third lower electrodes 131, 132, and 133.

The solder insulating layer 160 may include an insulating material. For example, the solder insulating layer 160 may include various insulating materials, such as polyamide, polyimide, polypropylene, ethylene vinyl acetate, polystyrene, polyvinyl chloride, epoxy resin, urethane resin, and phenol resin.

As for the shape of the second surface of the lead frame unit, the first, second, and third solder holes 151, 152, and 153 may have the solder hole height Ws on the second surface. In addition, each of the first, second, and third lower electrodes 131, 132, and 133 may have a lower electrode width Wb from one end of a corresponding of a solder hole among the first, second, and third solder holes 151, 152, and 153 to the other end facing the one end of the corresponding solder hole. Further, the body portion 110 may have a body portion margin We from one end of each of the first, second, and third solder holes 151, 152, and 153 to a facing end of the body portion 110.

A predetermined relationship may be established between the above-described solder hole height Ws, the lower electrode width Wb, and the body portion margin Wc, and thus the structural stability of the light emitting diode may be secured. In detail, the solder hole height Ws may be greater than the lower electrode width Wb, and the body portion margin Wc may be greater than the solder hole height Ws.

According to an exemplary embodiment, as for the relationship between the solder hole height Ws and the lower electrode width Wb, when the body portion 110 is coupled to the external frame by the solder paste, the body portion 110 may be prevented from being separated since the solder hole height Ws is set greater than the lower electrode width Wb. In detail, when the solder hole height Ws is equal to or smaller than the lower electrode width Wb, the solder paste provided in the first, second, and third solder holes 151, 152, and 153 may be spread too wide on the second surface of the body portion 110. In this case, the body portion 110 may be pulled toward the external frame while the spreading solder paste hardens, and thus, a portion of the body portion 110 and the light source unit may be separated from the external frame.

In addition, the body portion margin Wc may be greater than the solder hole height Ws. When the body portion margin Wc is greater than the solder hole height Ws, the rigidity of the body portion 110 may be secured. In detail, when the solder hole height Ws is equal to or greater than the body portion margin Wc, an empty space may be excessively increased in the body portion 110, and the rigidity of the body portion 110 may be lowered. In this case, the body portion 110 may be easily bent or damaged particularly due to an external force applied to a lateral direction (a direction perpendicular to the solder hole height Ws) of the body portion 110.

As such, according to an exemplary embodiment, a portion of the body portion 110 may be exposed on the lower surface of the body portion 110. In detail, the solder insulating layer 160 and/or the first, second, and third lower electrodes 131, 132, and 133 may not be provided on a portion of the lower surface of the body portion 110.

Referring to FIGS. 4B to 4E, solder insulating layers 160', 160'', 160''', and 160'''' according to exemplary embodiments may have various shapes. In detail, the shape of the solder insulating layers 160', 160'', 160', and 160'''' disposed adjacent to the first solder hole 151 may be different from the shape of the solder insulating layers 160', 160'', 160', and 160'''' disposed adjacent to the second solder hole 152 or the third solder hole 153.

In this manner, the types of electrode may be easily identified, and thus, the electrode may be prevented from being connected incorrectly. For example, it may be easily identified that the first solder hole 151 is connected to the cathode based on the shape of the solder insulating layers 160', 160'', 160', and 160'''', and thus, the first solder hole 151 may be prevented from being incorrectly connected to the anode of the external frame.

However, the inventive concepts are not limited to the shape change of only the solder insulating layers 160', 160", 160''', and 160'''' disposed adjacent to the first solder hole 151. For example, in some exemplary embodiments, the solder insulating layers 160', 160", 160''', and 160'''' disposed adjacent to the second solder hole 152 connected to the anode may have a different shape from that of the solder insulating layers 160', 160", 160''', and 160'''' disposed adjacent to the first solder hole 151 or the third solder hole 153. In addition to the shapes shown in FIGS. 4B to 4E, the solder insulating layers 160', 160", 160', and 160'''' may have be formed to have various shapes as long as the electrical connection between the first, second, and third solder holes 151, 152, and 153 and the external frame is not impeded. For example, in some exemplary embodiments, the solder insulating layers 160', 160", 160''', and 160'''' may be disposed to completely cover the first, second, and third solder holes 151, 152, and 153. In this case, the solder insulating layers 160', 160", 160''', and 160'''' may mechanically assist the components provided in the first, second, and third solder holes 151, 152, and 153 to not protrude out from the first, second, and third solder holes 151, 152 and 153 due to an external pressure.

Figure 4F:
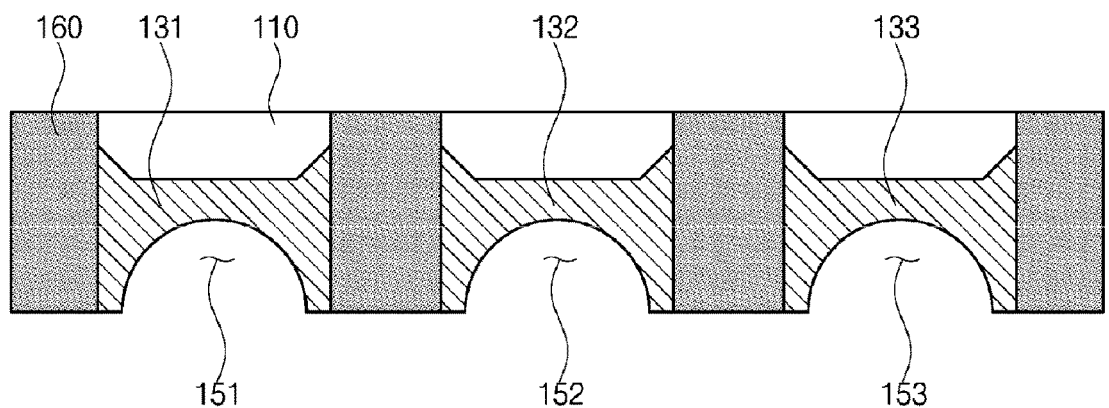
Figure 4G:
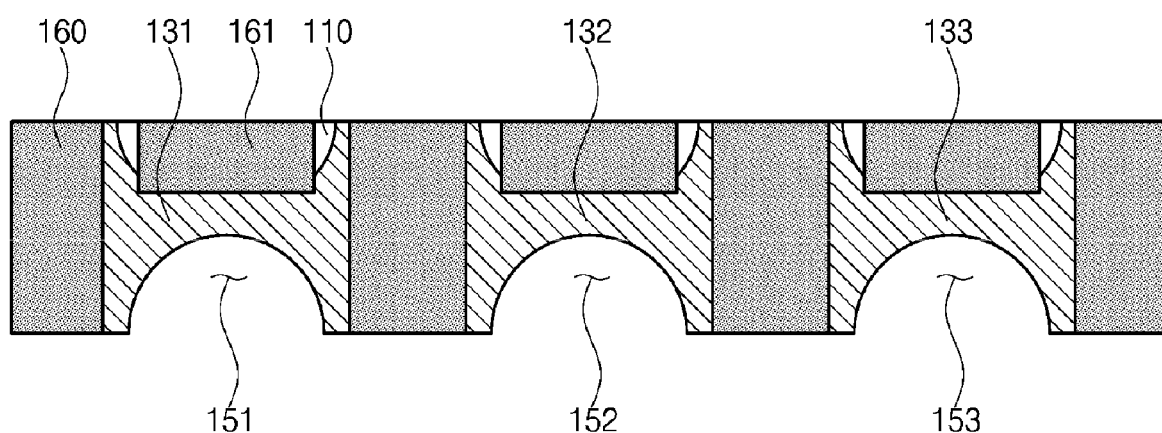

Referring to FIGS. 4F and 4G, according to exemplary embodiments, first, second, and third lower electrodes 131, 132, and 133 may have a bent shape in areas facing the first, second, and third solder holes 151, 152 and 153, respectively. In detail, the first, second, and third lower electrodes 131, 132, and 133 may have a shape protruding from an opposite surface to the surface provided with the first, second, and third solder holes 151, 152, and 153 in areas adjacent to the solder insulating layer 160. Accordingly, the body portion 110, which is exposed without being covered by the first, second, and third lower electrodes 131, 132, and 133 and the solder insulating layer 160, may have substantially a hexagonal shape as shown in figures.

Since the first, second, and third lower electrodes 131, 132, and 133 have the above-described shape in FIG. 4F, the electrical connection between the first to fourth connection portions, e.g., the connection conductive layer of the first to fourth connection portions provided via the through hole, and the first, second, and third lower electrodes 131, 132, and 133 may be secured. In addition, as the first, second, and third lower electrodes 131, 132, and 133 have the above-described shape, the body portion 110 and the light source unit may be prevented from being separated from the external frame when the body portion 110 is connected to the external frame by the solder paste. This is because the solder paste provided in the first, second, and third solder holes 151, 152, and 153 may not pull the body portion 110 toward the external frame, when the solder paste provided in the first, second, and third solder holes 151, 152, and 153 penetrates into the first, second, and third lower electrodes 131, 132, and 133 and hardens.

Referring to FIG. 4G, the first, second, and third lower electrodes 131, 132, and 133 have a different shape from those shown in FIG. 4F. In detail, the first, second, and third lower electrodes 131, 132, and 133 may have a bent shape, e.g., a gentle curved shape, in areas facing the first, second, and third solder holes 151, 152 and 153, respectively. Therefore, the exposed portion of the body portion 110 may have a semi-circular shape.

In addition, referring to FIG. 4G, an additional solder insulating layer 161 may be disposed on the exposed portion of the body portion 110. The additional solder insulating layer 161 covers the exposed portion of the body portion 110 and prevents the solder paste provided in the first, second, and third solder holes 151, 152 and 153 from penetrating into the exposed portion of the body portion 110 beyond the first, second, and third lower electrodes 131, 132, and 133. Thus, as described above, the body portion 110 and the light source unit may be prevented from being separated from the external frame when the body portion 110 is connected to the external frame, even though the solder paste is provided in an excessively large area as described above.

Figure 5A:
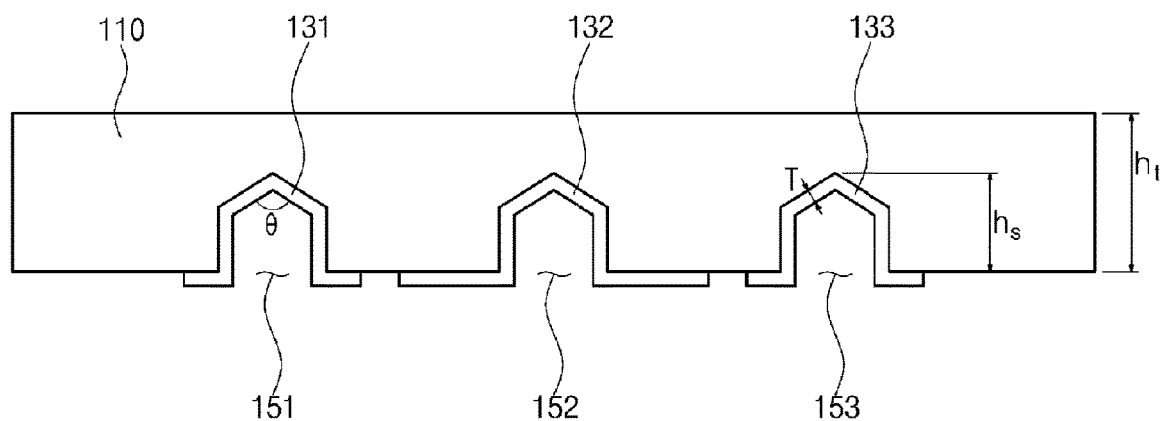
FIG. 5A is a side view of a third surface of a lead frame unit according to an exemplary embodiment.
Figure 5B:
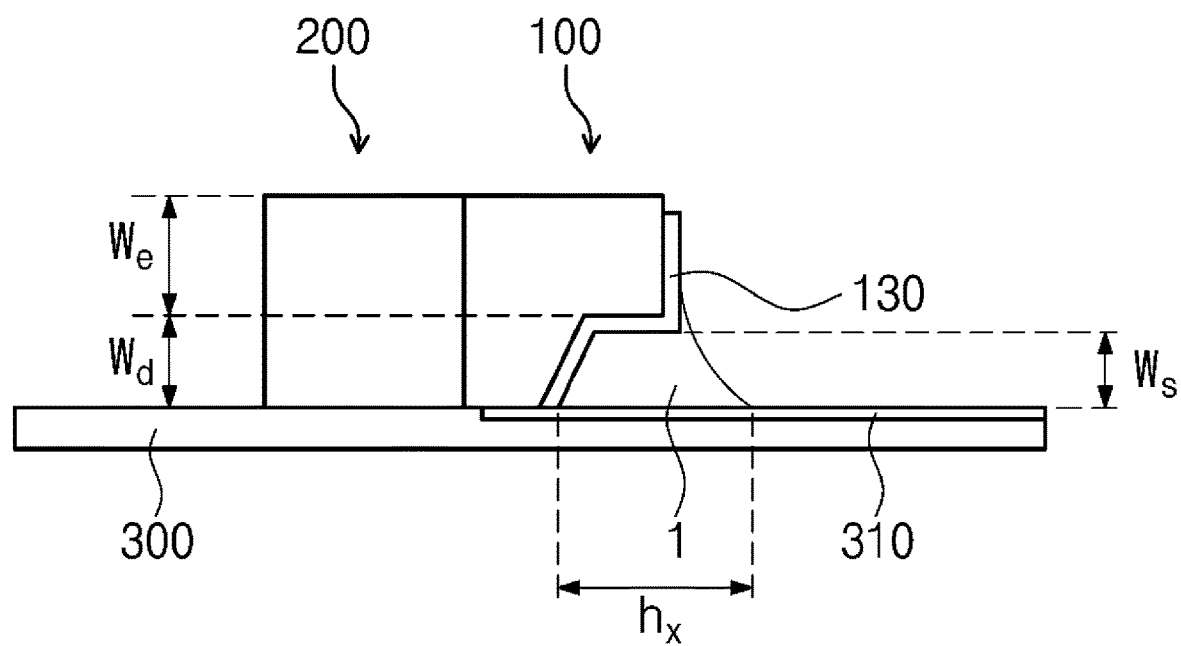
FIG. 5B is a cross-sectional view of a lead frame unit according to an exemplary embodiment.

FIG. 5A is a plan view of the third surface of the lead frame unit according to an exemplary embodiment, and FIG. 5B is a cross-sectional view of a light emitting diode according to an exemplary embodiment.

Referring to FIG. 5A, the body portion 110 may include the first, second, and third solder holes 151, 152 and 153. The first, second, and third solder holes 151, 152 and 153 may have a substantially pentagonal shape when viewed from the third surface (or the side surface) of the body portion 110.

In detail, the first, second, and third solder holes 151, 152 and 153 may have the substantially pentagonal shape extending from the second surface to the first surface when viewed from the third surface. For example, the pentagonal shape of the first, second, and third solder holes 151, 152 and 153 may have one side parallel to the second surface, and a vertex opposite to the one side of the pentagonal shape may face the first surface.

Since the first, second, and third solder holes 151, 152 and 153 have the substantially pentagonal shape, a superior heat dissipation characteristic and mechanical stability may be secured when the light emitting diode is connected to the external frame by the solder paste.

In more detail, the first solder hole 151 having the substantially pentagonal shape may have at least one internal angle of about 120 degrees to about 170 degrees when viewed from the side surface. In this case, the internal angle of the pentagonal shape having the angle of the above-mentioned range may be referred to as a vertex angle θ. The vertex angle θ of the first solder hole 151 may be located at a position closest to the upper surface of the body portion 110.

When the vertex angle θ of the first solder hole 151 has the angle of the above-mentioned range, the solder paste and the light emitting diode may be stably coupled to each other. For example, when the vertex angle is each less than about 120 degrees, an area corresponding to the vertex angle θ may be filled with less solder paste. In this case, when the solder paste is cooled, bubbles may be formed in the area of the vertex angle θ, and thermal characteristics of the light emitting diode and the external frame may be degraded. When the vertex angle θ is greater than about 170 degrees, and the solder paste is cooled, bubbles may be formed in the area of the vertex angle θ, and the first solder hole 151 may not be completely filled with the solder paste. In this case, the light emitting diode may be tilted, shifted, or rotated with respect to the external frame without being fixed to the external frame. As described above, the first solder hole 151 according the illustrated exemplary embodiment may have the substantially pentagonal shape having the vertex angle from about 120 degrees to about 170 degrees, and thus not only the thermal characteristics may be improved but also the light emitting diode may be stably fixed to the external frame.

However, the inventive concepts are not limited thereto, and in some exemplary embodiments, the first solder hole 151 may have a shape different from the shape shown in FIG. 5A. For example, the area corresponding to the vertex angle θ of the first solder hole 151 may be rounded or chamfered. In this case, the vertex angle θ may be an angle formed by extension lines of two straight lines that define the area corresponding to the vertex angle θ.

A height hs of the first solder hole 151 may be within a range from about 50% to about 80% of a height ht of the body portion 110. As described above, when the height hs of the first solder hole 151 is within the range from about 50% to about 80% of the height ht of the body portion 110, the light emitting diode may be stably fixed to the external frame without degrading the structural stability of the body portion 110.

Referring back to FIG. 1, a second insulating layer may be disposed around the first, second, and third solder holes 151, 152 and 153 along edges of the first, second, and third solder holes 151, 152 and 153. The second insulating layer may be formed between the first, second, and third lower electrodes 131, 132, and 133, which are spaced apart from each other and respectively disposed in the first, second, and third solder holes 151, 152 and 153.

The first, second, and third lower electrodes 131, 132, and 133 may be disposed to cover portions of the body portion 110, which define the first, second, and third solder holes 151, 152 and 153, and portions of the lower surface of the body portion 110, which are adjacent to the first, second, and third solder holes 151, 152 and 153. Accordingly, when the solder paste is provided in the first, second, and third solder holes 151, 152 and 153, the light emitting diode and the external frame may be electrically and stably connected to each other by the solder paste.

Although the lead frame unit of FIG. 5A has been described with reference to the first solder hole 151, it is noted that, however, the second solder hole 152 and/or the third solder hole 153 may have substantially the same structure as that of the first solder hole 151.

Referring to FIG. 5A, the first, second, and third lower electrodes 131, 132, and 133 may have a lower electrode thickness T when viewed from the third surface. The lower electrode thickness T may be within a range from about 10 μm to about 30 μm. When the lower electrode thickness T exceeds about 30 μm, an adhesive force between the first, second, and third lower electrodes 131, 132, and 133 and the body portion 110 may be insufficient, and thus, the first, second, and third lower electrodes 131, 132, and 133 may be separated from the body portion 110. When the lower electrode thickness T is less than about 10 μm, defects, such as the first, second, and third lower electrodes 131, 132, and 133 are not being formed in some portions of the first, second, and third lower electrodes 131, 132, and 133 may occur, even with small errors in the process, which may significantly reduce the electrical conductivity.

In FIG. 5B, the cross-sectional view of the light emitting diode is shown. The first, second, and third solder holes may have the solder hole height Ws and a solder hole depth hx in the cross-section. The solder hole depth hx may be greater than the solder hole height Ws. Since the solder hole depth hx of the first, second, and third solder holes are greater than the corresponding solder hole height Ws, the adhesive force between the lead frame unit 100 and an external frame 300 may be secured by the solder paste provided in the first, second, and third solder holes. In detail, since the lead frame unit 100 is attached to the external frame 300 by the solder paste in the relatively large surface, the lead frame unit 100 and the light source unit 200 may be prevented from being separated due to the reduction of the adhesive force.

In addition, the lead frame unit 100 may have a first height Wd and a second height We in the cross-section. The first height Wd may be a distance from a surface of the lead frame unit 100 that meets the external frame 300 to the first, second, and third lower electrodes surrounding the first, second, and third solder holes. The second height We may be a height obtained by subtracting the first height Wd from the thickness of the body portion, e.g., a distance from the first, second, and third lower electrodes to a front surface of the lead frame unit 100. A relationship between the first height Wd and the second height We may be established, such that the first height Wd is smaller than the second height We. Accordingly, the size of the empty space of the lead frame unit 100 for providing the first, second, and third solder holes may be relatively small, and thus, the rigidity of the lead frame unit 100 may be secured.

Figure 6:
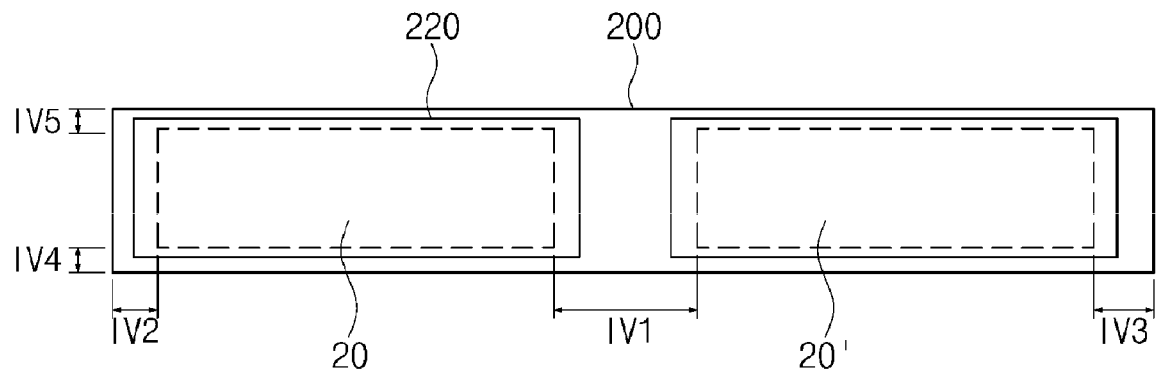
FIG. 6 is a plan view of a light emitting diode according to an exemplary embodiment.

FIG. 6 is a plan view of a light emitting diode according to an exemplary embodiment.

Referring to FIG. 6, the light emitting diode may include the first light emitting diode chip 20 and the second light emitting diode chip 20'. The first light emitting diode chip 20 and the second light emitting diode chip 20' are disposed to be spaced apart from each other.

Referring to FIG. 6, the first light emitting diode chip 20 and the second light emitting diode chip 20' may be disposed to be spaced apart from each other by a first interval IV1. The first interval IV1 may be within a range from about 470 nm to about 500 nm. When the first interval IV1 is less than about 470 nm, light emitted from the first light emitting diode chip 20 interferes with light emitted from the second light emitting diode chip 20', and light may not be emitted in a desired form. When the first interval IV1 exceeds about 500 nm, the size of the light emitting diode may become excessively large, and thus, a usability of the light emitting diode may be deteriorated.

Referring to FIG. 6, the first light emitting diode chip 20 and the second light emitting diode chip 20' may be disposed to be spaced apart from an edge of the light source unit 200 by a predetermined distance. In this case, a distance between the edge of the light source unit 200 and the first light emitting diode chip 20 and the second light emitting diode chip 20' may be referred to as a "light emitting diode chip margin". The light emitting diode chip margin may vary depending on positions of the first light emitting diode chip 20 and the second light emitting diode chip 20'. For example, as described below, the light emitting diode chip margin may be referred to as second, third, fourth, and fifth intervals IV2, IV3, IV4, and IV5 depending on positions of the first light emitting diode chip 20 and the second light emitting diode chip 20'.

Referring to FIG. 6, the first light emitting diode chip 20 may be disposed to be spaced apart from one end of the light source unit 200 by a second interval IV2. As used herein, the term "one end of the light source unit 200" may refer to a surface adjacent to the first light emitting diode chip 20 among short surfaces of the light emitting diode. When the light transmission portion is provided to cover the first light emitting diode chip 20, the light transmission portion may be disposed to be spaced apart from the one end of the light source unit 200 by the second interval IV2 when viewed from the upper surface of the light emitting diode. The second interval IV2 may be within a range from about 90 nm to about 110 nm. When the second interval IV2 is less than about 90 nm, the external force provided from the outside of the light emitting diode or the light source unit 200 may be applied to the first light emitting diode chip 20 without being buffered, and the first light emitting diode chip 20 may be damaged. When the second interval IV2 exceeds about 110 nm, the size of the light emitting diode may become excessively large, and thus, a usability of the light emitting diode may be deteriorated.

Referring to FIG. 6, the second light emitting diode chip 20' may be disposed to be spaced apart from the other end of the light source unit 200 by a third interval IV3. As used herein, the term "the other end of the light source unit 200" may refer to a surface adjacent to the second light emitting diode chip 20' among the short surfaces of the light emitting diode. The third interval IV3 may be within a range from about 100 nm to about 120 nm. When the third interval IV3 is less than about 100 nm, the external force provided from the outside of the light emitting diode or the light source unit 200 may be applied to the second light emitting diode chip 20' without being buffered, and the second light emitting diode chip 20' may be damaged. When the third interval IV3 exceeds about 120 nm, the size of the light emitting diode may become excessively large, and thus, the usability of the light emitting diode may be deteriorated.

As described above, the third interval IV3 may be greater than the second interval IV2. This is because the surface on which the second light emitting diode chip 20' of the light emitting diode is located may be arranged close to the outside or other components when the light emitting diode is connected to the external frame and applied to other components. Accordingly, the second light emitting diode chip 20' may be exposed to the external force relatively more than the first light emitting diode chip 20. As such, the third interval IV3 may be greater than the second interval IV2 to prevent the second light emitting diode chip 20' from being damaged due to the external force.

The first interval V1 may be greater than the second interval IV2 and the third interval IV3. Accordingly, when viewed from the top of the light source unit 200, the first light emitting diode chip 20 and the second light emitting diode chip 20' may be respectively inclined to different sides of the light source unit 200. Since the first interval V1 may be greater than the second interval IV2 and the third interval IV3, it is possible to prevent unnecessary interference between the light emitted from the first light emitting diode chip 20 and the light emitted from the second light emitting diode chip 20'.

Referring to FIG. 6, the first light emitting diode chip 20 and/or the second light emitting diode chip 20' may be disposed to be spaced apart from a rear surface of the light emitting diode by a fourth interval IV4. The fourth interval IV4 may be about 40 nm. When the fourth interval IV4 is set to about 40 nm, unnecessary electrical connection may be prevented from occurring between the first light emitting diode chip 20 and/or the second light emitting diode chip 20' and the electrodes on the external frame, and the size of the light emitting diode may be formed slim.

In addition, the first light emitting diode chip 20 and/or the second light emitting diode chip 20' may be disposed to be spaced apart from a front surface of the light emitting diode by a fifth interval IV5. The fifth interval IV5 may be within a range from about 45 nm to about 50 nm. When the fifth interval IV5 is less than about 45 nm, the first light emitting diode chip 20 and/or the second light emitting diode chip 20' may be easily damaged due to the external force applied to the front surface of the light emitting diode. When the fifth interval IV5 exceeds about 50 nm, the light emitting diode may become excessively thick.

As described above, the fifth interval IV5 may be greater than the fourth interval IV4. The fourth interval IV4 may be relatively small since the fourth interval IV4 is provided to prevent unnecessary electrical connection from occurring between the first and/or second light emitting diode chips 20 and/or 20' and the external frame by separating the first and/or second light emitting diode chips 20 and/or 20' from the external frame. On the other hand, the fifth interval IV5 may be relatively large because the fifth interval IV5 may serve to buffer the external force. As the fifth interval IV5 is greater than the fourth interval IV4, the unnecessary electrical connection may be prevented from occurring, the external force may be buffered, and the light emitting diode may be formed slim.

According to the illustrated exemplary embodiment, since the first light emitting diode chip 20 and/or the second light emitting diode chip 20' are designed to satisfy a specific distance relationship on the light source unit 200, the light emitting diode may be formed slim, and the light emitting diode may have improved structural stability.

Figure 7:
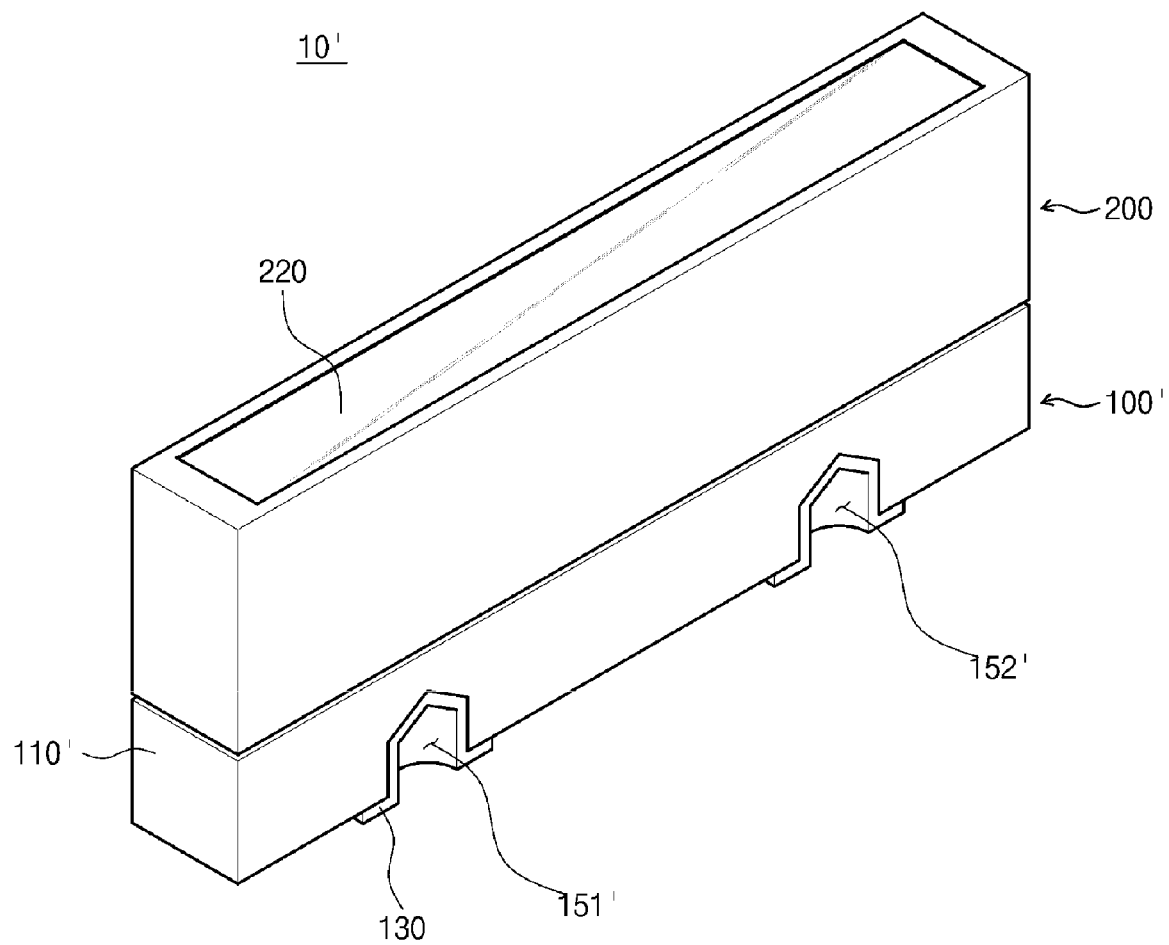
FIG. 7 is a perspective view of a light emitting diode according to an exemplary embodiment.
Figure 8A:
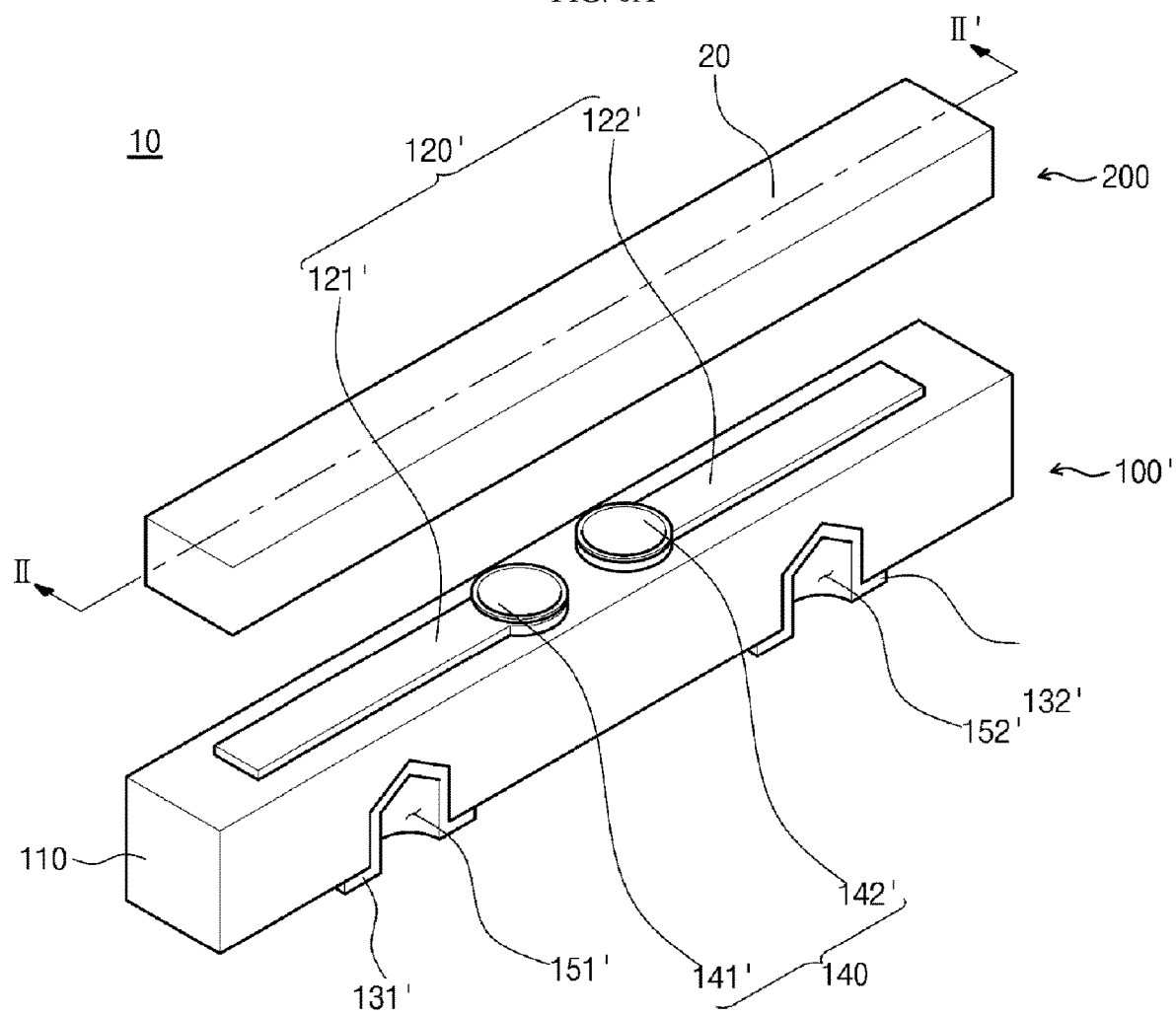
FIG. 8A is a perspective view of a light emitting diode according to an exemplary embodiment.
Figure 8B:
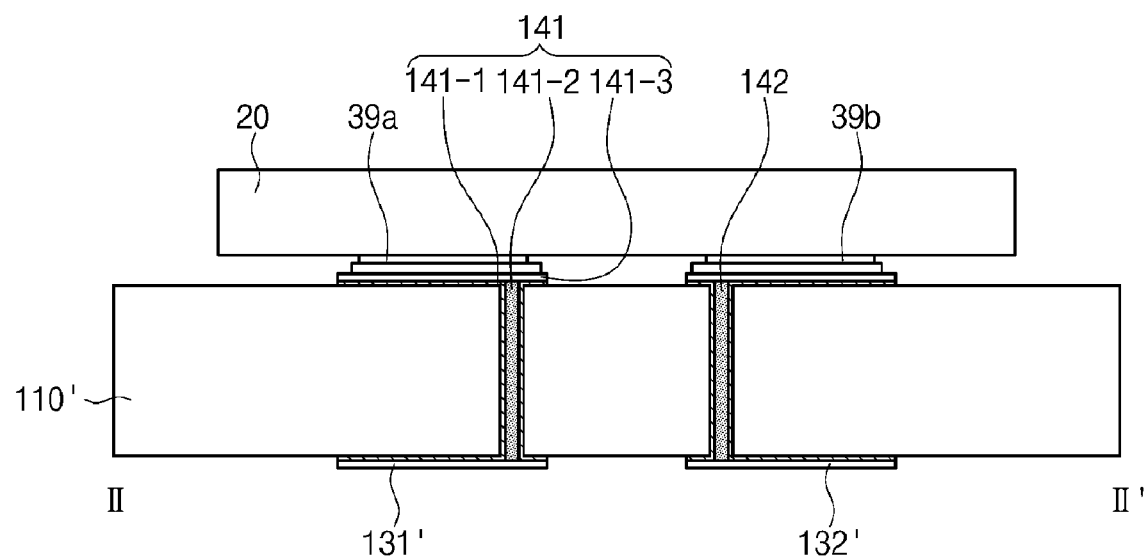
FIG. 8B is a cross-sectional view taken along line II-II' of FIG. 8A.

FIG. 7 is a perspective view of a light emitting diode according to an exemplary embodiment, FIG. 8A is a perspective view of the light emitting diode of FIG. 7 according to an exemplary embodiment, and FIG. 8B is a cross-sectional view taken along line II-II' of FIG. 8A.

The light emitting diode of FIGS. 7, 8A, and 8B is substantially similar to the light emitting diode of FIGS. 1, 2A, and 2B. Accordingly, the same or similar components will be assigned with the same or similar reference numerals, and repeated or redundant descriptions thereof will be omitted to avoid redundancy.

Referring to FIGS. 7, 8A, and 8B, a lead frame unit 100' includes a first solder hole 151' and a second solder hole 152', and a light source unit 200' includes one light emitting diode chip 20.

As compared to the light source unit 200 of FIGS. 1 to 5B that includes two light emitting diode chips, the light source unit 200' according to the illustrated exemplary embodiment shown in FIGS. 7 to 8B includes one light emitting diode chip. As such, the shapes of a first conductive layer 120' and a second conductive layer may be changed.

In more detail, the first conductive layer 120' may include one first upper electrode 121' and one second upper electrode 122'. Pad portions 39a and 39b of the light emitting diode chip 20 may be respectively mounted on the first upper electrode 121' and the second upper electrode 122'.

The second conductive layer may include one first lower electrode 131' and one second lower electrode 132'. The first lower electrode 131' and the second lower electrode 132' may be disposed to overlap with the first upper electrode 121' and the second upper electrode 122', respectively, when viewed in a plan view.

The first upper electrode 121' and the first lower electrode 131' may have substantially the same function as each other. For example, the first upper electrode 121' and the first lower electrode 131' may serve as a cathode. In this case, the second upper electrode 122' and the second lower electrode 132' may serve as an anode. However, in some exemplary embodiments, the first upper electrode 121' and the first lower electrode 131' may serve as the anode, and the second upper electrode 122' and the second lower electrode 132' may serve as the cathode.

The first upper electrode 121' and the second upper electrode 122' may include a cover plate 141_3 described below. However, according to another exemplary embodiment, the first upper electrode 121' and the second upper electrode 122' may include the cover plate 141_3 and a bump disposed on the cover plate 141_3. In some exemplary embodiments, however, the bump may be omitted to thin the lead frame unit 100'.

A first connection portion 141' and a second connection portion 142' may be provided to connect the first conductive layer 120' and the second conductive layer. In detail, the first connection portion 141' may connect the first upper electrode 121' and the first lower electrode 131', and the second connection portion 142' may connect the second upper electrode 122' and the second lower electrode 132'. The first connection portion 141' and the second connection portion 142' may be disposed to penetrate the body portion 110'.

A first through hole 151' and a second through hole 152' are defined in a lower surface of the body portion 110'. According to the illustrated exemplary embodiment, only two through holes 151' and 152' may be defined in the body portion 110'. However, the inventive concepts are not limited thereto, and in some exemplary embodiments, more through holes may be provided in the body portion 110' in addition to the first through hole 151' and the second through hole 152' for heat dissipation, for example.

The first lower electrode 131' may be disposed in the first through hole 151', and the second lower electrode 132' maybe disposed in the second through hole 152'. The first lower electrode 131' and the second lower electrode 132' may be electrically connected to an external frame by a solder paste provided in the first through hole 151' and the second through is hole 152'. In addition, a driving signal and power provided from the external frame may be applied to the light emitting diode chip 20 via the first lower electrode 131' and the second lower electrode 132' disposed in the first through hole 151' and the second through hole 152'.

In some exemplary embodiments, a solder insulating layer may be further disposed on the lower surface of the body portion 110'. However, according to another exemplary embodiment, when one light emitting diode chip 20 is mounted on the body portion 110', the solder insulating layer may be omitted to keep the lead frame unit slim.

As described above, the light emitting diode according to the illustrated exemplary embodiment may be formed so that one light emitting diode chip is mounted.

Figure 9A:
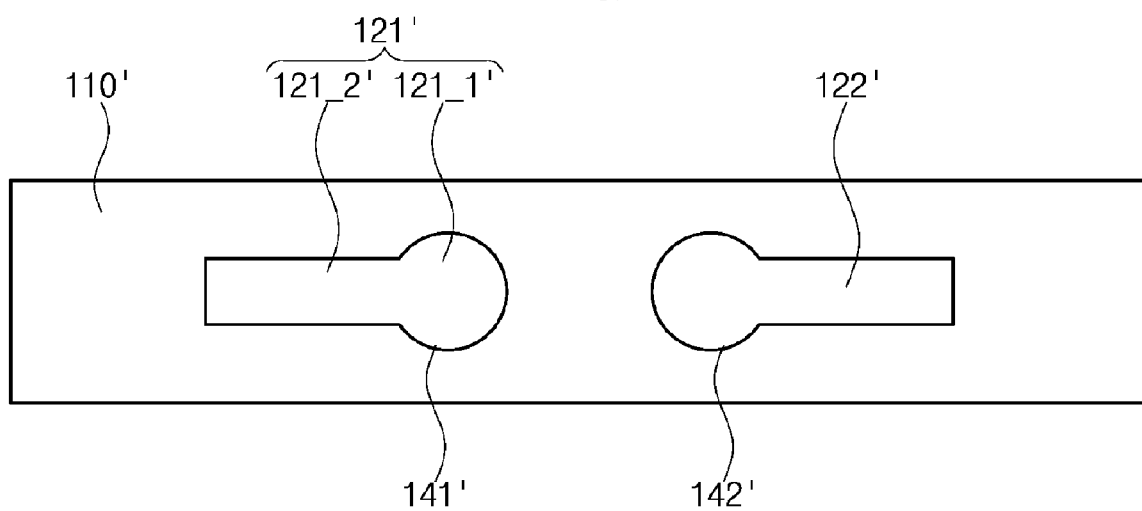
FIGS. 9A and 9B are plan views of a first surface and a second surface of a lead frame unit according to an exemplary embodiment, respectively.
Figure 9B:
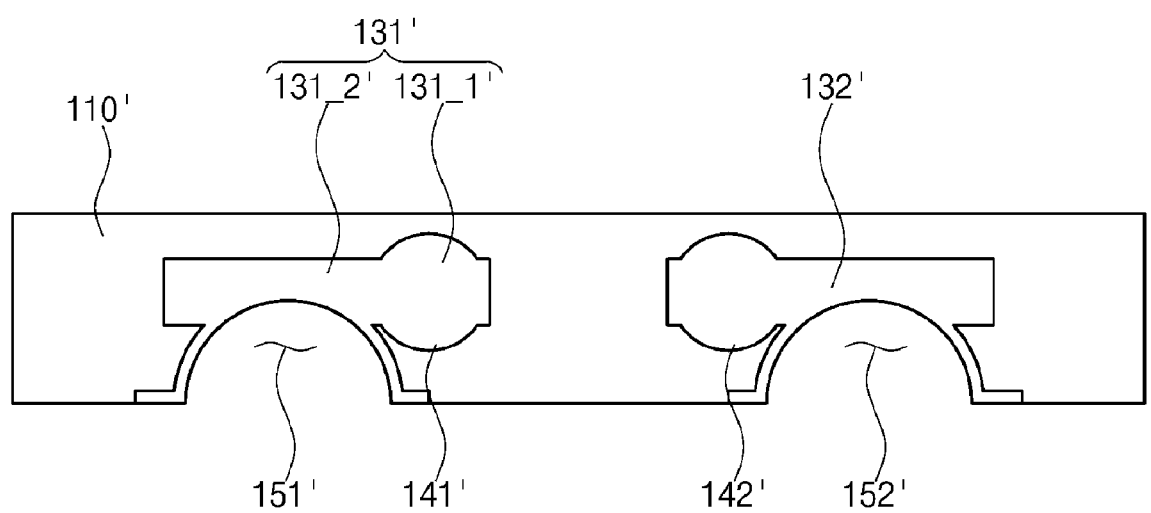

FIGS. 9A and 9B are plan views of a first surface and a second surface of the lead frame unit of FIG. 8, respectively according to an exemplary embodiment.

Referring to FIG. 9A, the first upper electrode 121' and the second upper electrode 122' are disposed on a first surface (or an upper surface) of the body portion 110'. The first upper electrode 121' includes a circular portion 121_1' and an elongated portion 121_2'.

The first connection portion 141' may be disposed in the circular portion 121_1'. Since the first connection portion 141' is disposed in the circular portion 121_1' having a relatively large diameter, a through hole required to provide the first connection portion 141' may be easily formed.

In addition, the pad portion of the light emitting diode chip may be mounted on the elongated portion 121_2'. Since the light emitting diode chip is mounted on the elongated portion 121_2' having a relatively long length, the light emitting diode chip may be easily mounted.

Referring to FIG. 9B, the first lower electrode 131' and the second lower electrode 132' are disposed on a second surface (or a lower surface) of the body portion 110'. The first lower electrode 131' and the second lower electrode 132' may be disposed to surround an edge of the first through hole 151' and the second through hole 152', respectively.

The first lower electrode 131' may include a lower circular portion 131_1' and a lower elongated portion 131_2'. The first connection portion 141 may be disposed in the lower circular portion 131_1'. The lower circular portion 131_1' may be disposed to overlap with the circular portion 121_1' when viewed in a plan view.

As described above, since one light emitting diode is disposed on the lead frame unit according to the illustrated exemplary embodiment, one first upper electrode 121' and one second upper electrode 122' may be provided on the upper surface of the body portion 110', and one first lower electrode 131' and one second lower electrode 132' may be provided on the lower surface of the body portion 110'.

Figure 10A:
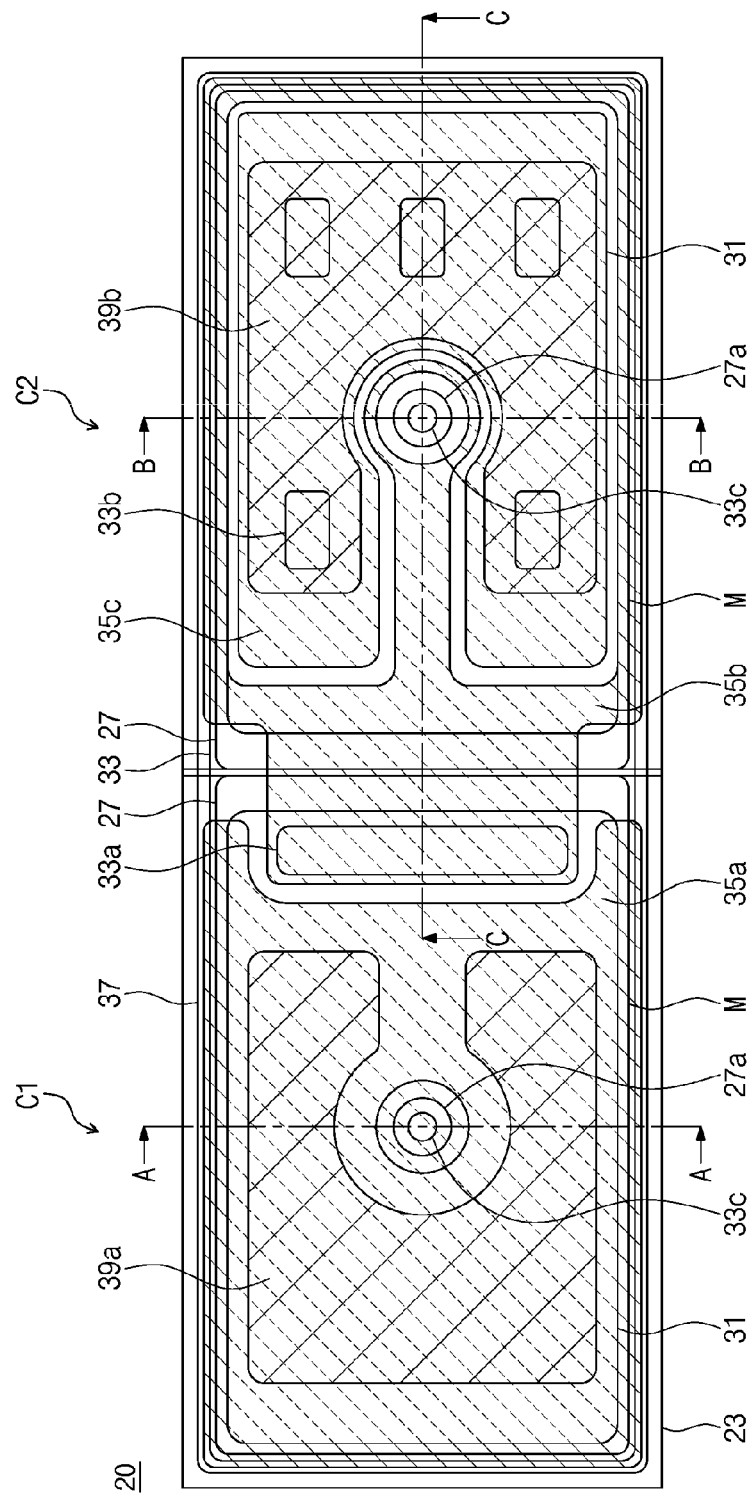
FIG. 10A is a plan view of a light source unit according to an exemplary embodiment.
Figure 10B:
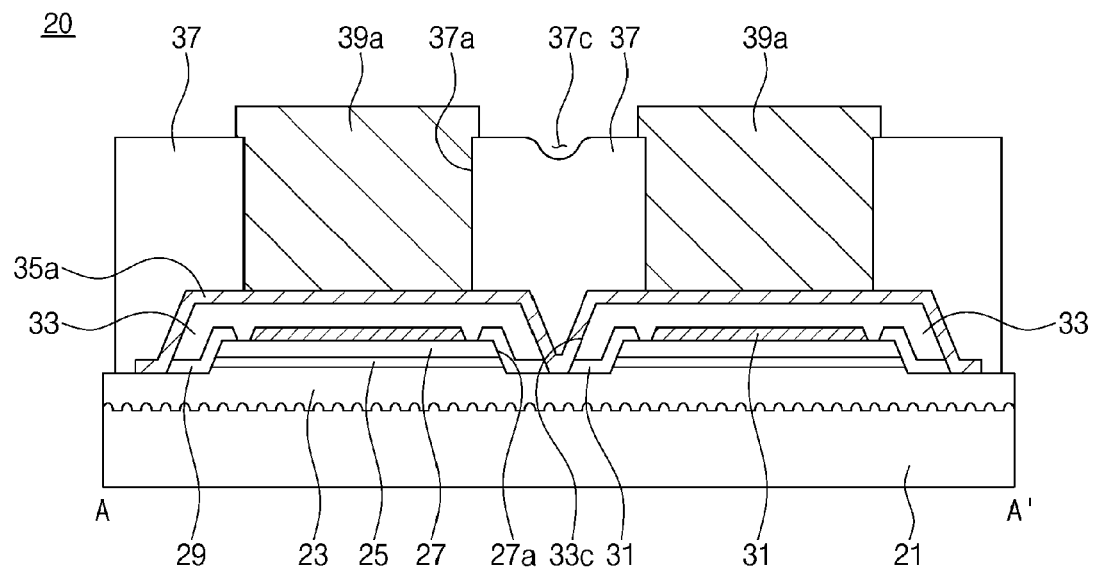
FIG. 10B is a cross-sectional view taken along line A-A' of FIG. 10A.
Figure 10C:
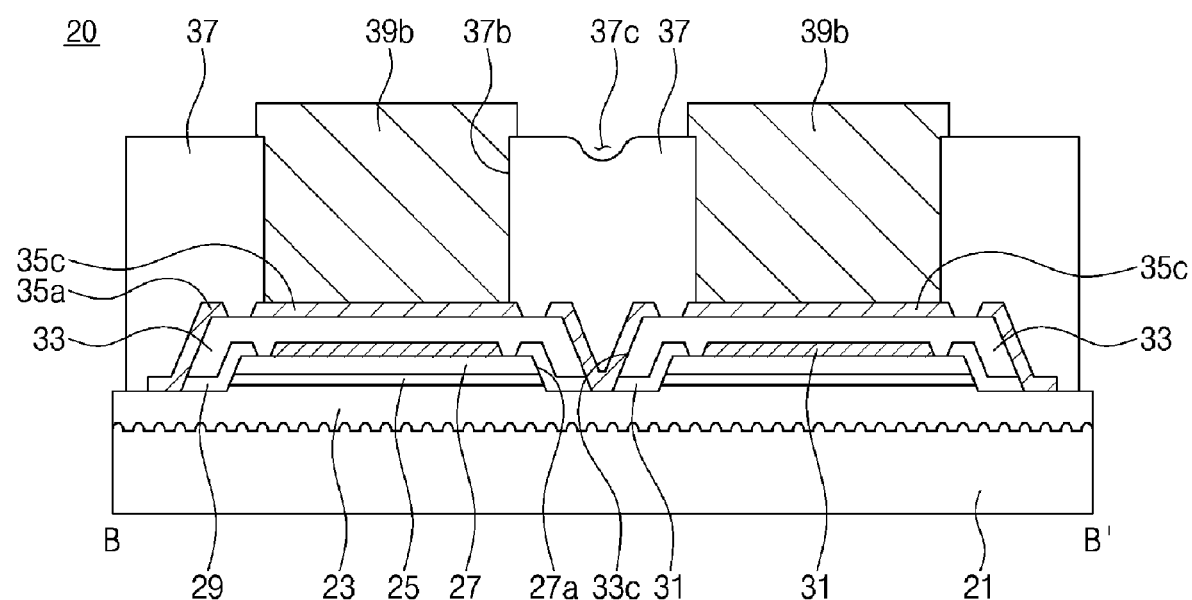
FIG. 10C is a cross-sectional view taken along line B-B' of FIG. 10A.
Figure 10D:
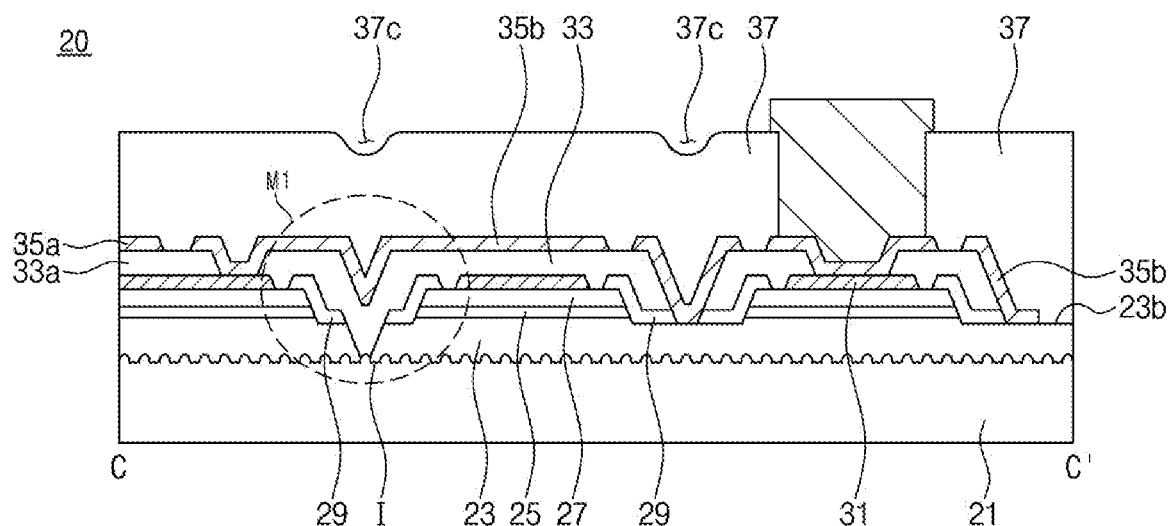
FIG. 10D is a cross-sectional view taken along line C-C' of FIG. 10A.
Figure 10E:
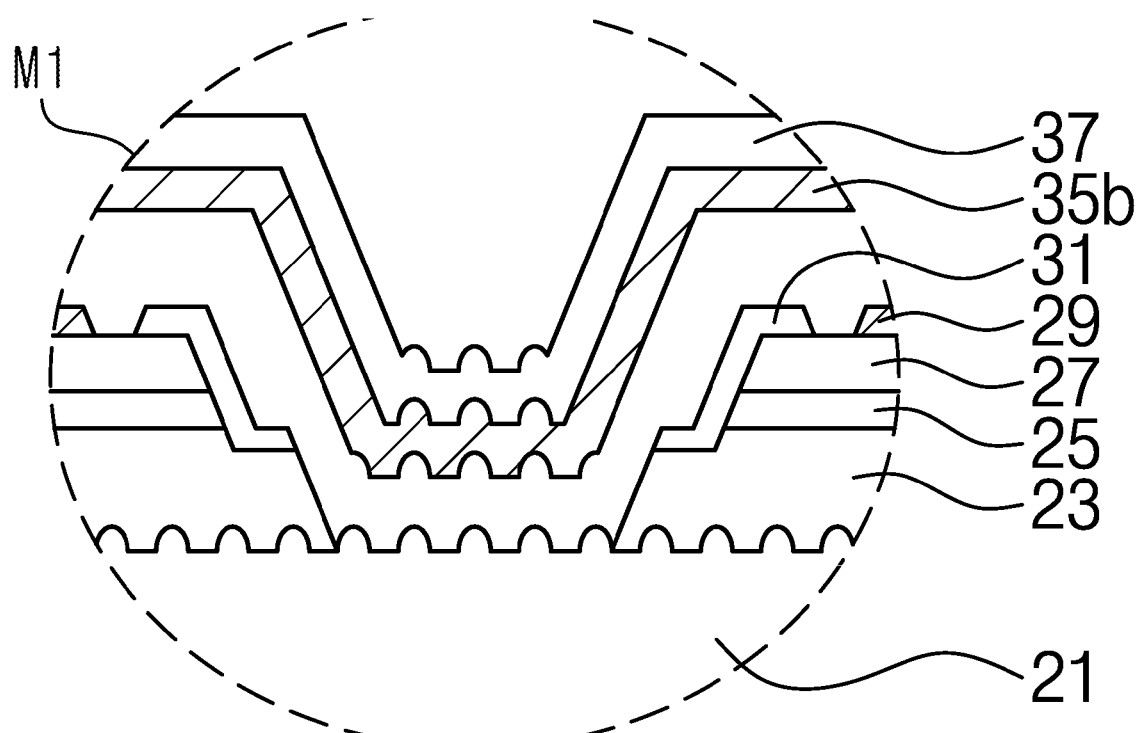
FIG. 10E is a magnified view of M1 in FIG. 10D.

FIG. 10A is a plan view of a light source unit according to an exemplary embodiment, FIG. 10B is a cross-sectional view taken along line A-A' of FIG. 10A, FIG. 10C is a cross-sectional view taken along line B-B' of FIG. 10A, FIG. 10D is a cross-sectional view taken along line C-C' of FIG. 10A, and FIG. 10E is a magnified view of M1 in FIG. 10D.

Referring to FIGS. 10A to 10E, the light emitting diode chip 20 of the light source unit is shown in more detail. FIG. 10A shows the plan view of the light emitting diode chip 20, and FIGS. 10B, 10C, and 10D show cross-sectional views respectively taken along lines A-A', B-B', and C-C' of FIG. 10A.

Referring to FIGS. 10A to 10D, the light emitting diode chip 20 includes a substrate 21, a first light emitting cell C1, a second light emitting cell C2, a reflective structure 31, first, second, and third contact layers 35a, 35b, and 35c, a first electrode pad 39a, and a second electrode pad 39b. In addition, the light emitting diode chip 20 may include a preliminary insulating layer 29, a lower insulating layer 33, and a resin layer 37. In addition, each of the first and second light emitting cells C1 and C2 includes an n-type semiconductor layer 23, an active layer 25, and a p-type semiconductor layer 27. In the illustrated exemplary embodiment, the light emitting diode chip has a series multi junction structure, however, the inventive concepts are not limited thereto, and in some exemplary embodiments, and the light emitting diode chip may have another structure.

The substrate 21 may be a growth substrate for growing a group III-V nitride-based semiconductor layer, for example, a sapphire substrate, in particular, a patterned sapphire substrate. The substrate 21 may be an insulating substrate, without being limited thereto. When the light emitting cells disposed on the substrate 21 are connected to each other in series, the substrate 21 is required to be insulated from the light emitting cells. Accordingly, when the substrate 21 is insulative or conductive, an insulating material layer may be disposed between the substrate 21 and the first and second light emitting cells C1 and C2, such that the first and second light emitting cells C1 and C2 are insulated from the substrate 21. The substrate 21 may have a substantially rectangular shape as shown in FIG. 10A. A side surface of the substrate 21 may be formed by a laser scribing process and a cracking process using the laser scribing process, for example. In addition, the substrate 21 may be removed from the first and second light emitting cells C1 and C2 by using a process, such as a laser lift-off process, a chemical lift-off process, or a grinding process.

The first and second light emitting cells C1 and C2 are disposed on the substrate 21. The first and second light emitting cells C1 and C2 are separated from each other by a separation area I through which the substrate 21 is partially exposed. As used herein, the separation area I refers to an area provided to separate the first and second light emitting cells C1 and C2 from each other, and is distinguished from a scribing or dicing area for separating the substrate 21. Semiconductor layers of the first and second light emitting cells C1 and C2 are spaced apart from each other by the separation area I. The first and second light emitting cells C1 and C2 may be disposed to face each other and may have a substantially square shape or a substantially rectangular shape. In particular, the first and second light emitting cells C1 and C2 may have the substantially rectangular shape elongated in a direction in which the first and second light emitting cells C1 and C2 face each other.

Each of the first and second light emitting cells C1 and C2 includes the n-type semiconductor layer 23, the active layer 25, and the p-type semiconductor layer 27. The n-type semiconductor layer 23, the active layer 25, and the p-type semiconductor layer 27 may be formed of the group III-V nitride-based semiconductor, for example, a nitride-based semiconductor, such as (Al, Ga, In)N. The n-type semiconductor layer 23, the active layer 25, and the p-type semiconductor layer 27 may be grown on the substrate 21 by a metal organic chemical vapor deposition (MOCVD) method in a chamber, for example. In addition, the n-type semiconductor layer 23 includes an n-type dopant, such as Si, Ge, or Sn, and the p-type semiconductor layer 27 includes a p-type dopant, such as Mg, Sr, or Ba. For example, the n-type semiconductor layer 23 may include GaN or AlGaN, which includes Si as the dopant, and the p-type semiconductor layer 27 may include GaN or AlGaN, which includes Mg as the dopant. Each of the n-type semiconductor layer 23 and the p-type semiconductor layer 27 is shown as having a single-layer structure, however, the inventive concepts are not limited thereto, and in some exemplary embodiments, these layers may have a multi-layer structure or may include a superlattice layer. The active layer 25 may have a single quantum well structure or a multiple quantum well structure, and a composition ratio of the nitride-based semiconductor may be adjusted to emit a light having a desired wavelength. For example, the active layer 25 may emit a blue light or an ultraviolet light.

The separation area I separates the first and second light emitting cells C1 and C2 from each other. The substrate 21 is exposed through the semiconductor layers in the separation area I. The separation area I is formed by using a photolithography process. In this case, a photoresist is reflowed using a high-temperature baking process to form a photoresist pattern having a gentle slope, the photoresist pattern is used as a mask to etch the semiconductor layers, and thus, side surfaces may be formed in the separation area I with relatively gentle inclination. In addition, as shown in FIG. 10D, a stepped inclined surface may be formed in the separation area I. The stepped inclined surface may be formed in the separation area I during a process for forming a mesa that exposes the n-type semiconductor layer 23, and by forming the separation area I that exposes the substrate 21.

The first and second light emitting cells C1 and C2 face each other with the separation area I interposed therebetween. Hereinafter, side surfaces of the first and second light emitting cells C1 and C2 facing each other will be referred to as inner side surfaces. In addition, side surfaces of the first and second light emitting cells C1 and C2 except for the inner side surfaces will be referred to as outer side surfaces. Accordingly, the n-type semiconductor layers 23 of the first and second light emitting cells C1 and C2 include the inner and outer side surfaces as well.

For example, the n-type semiconductor layer 23 may include one inner side surface and three outer side surfaces. As shown in FIG. 10D, the outer side surfaces of the n-type semiconductor layers 23 may have a steep slope relative to the inner side surface. In the illustrated exemplary embodiment, the outer side surfaces of the n-type semiconductor layers 23 are described to have the steep slope relative to the inner side surface, however, the inventive concepts are not limited thereto. For example, at least one outer side surface may have the steep slope relative to the inner side surface. As another example, only both outer side surfaces perpendicular to the separation area I may be relatively steeply inclined, and the outer side surface parallel to the separation area I may be inclined gently as the separation area I.

Further, the outer side surfaces, which are relatively steeply inclined, may be substantially parallel to the side surface of the substrate 21. For example, the outer side surfaces of the n-type semiconductor layers 23 may be formed by scribing the n-type semiconductor layer 23 together with the substrate 21, and thus, may be formed with the side surfaces of the substrate 21.

The mesa M is disposed on each n-type semiconductor layer 23. The mesa M may be disposed within an area surrounded by the n-type semiconductor layer 23, and thus, areas near edges adjacent to the outer side surfaces of the n-type semiconductor layer 23 are exposed to the outside without being covered by the mesa M. In addition, a side surface of the mesa M and the side surface of the n-type semiconductor layer 23 are discontinuous to each other on a sidewall of the separation area I, so that the above-mentioned stepped inclined surface may be formed.

The mesa M includes the p-type semiconductor layer 27 and the active layer 25. The active layer 25 is disposed between the n-type semiconductor layer 23 and the p-type semiconductor layer 27. An inner side surface of the mesa M is shown as being inclined as the outer surfaces thereof, however, the inventive concepts are not limited thereto. For example, the inner side surface of the mesa M may be more gently inclined than the outer surfaces thereof. In this manner, a stability of the second contact layer 35b, which will be described later, may be improved.

The mesa M may be provided with a through hole 27a defined through the p-type semiconductor layer 27 and the active layer 25. In some exemplary embodiments, a plurality of through holes may be formed in the mesa M, however, the single through hole 27a may be formed in the mesa M as shown in FIG. 10A. In this case, the through hole 27a may have a substantially circular shape at a center of the mesa M, without being limited thereto. For example, the through hole 27a may have an elongated shape passing through the center of the mesa M.

The reflective structure 31 is disposed on each of the p-type semiconductor layers 27 of the first and second light emitting cells C1 and C2. The reflective structure 31 makes contact with the p-type semiconductor layer 27. The reflective structure 31 may be provided with an opening that exposes the through hole 27a, and may be disposed over substantially the entire area of the mesa M in an upper area of the mesa M. For example, the reflective structure 31 may cover about 80% or more, specifically about 90% or more, of the upper area of the mesa M.

The reflective structure 31 may include a reflective metal layer having a reflective property, and thus, may reflect light generated from the active layer 25 and traveling to the reflective structure 31. For instance, the reflective metal layer may include Ag or Al. In addition, an Ni layer may be disposed between the reflective metal layer and the p-type semiconductor layer 27 to help the reflective structure 31 making an ohmic contact with the p-type semiconductor layer 27. In some exemplary embodiments, the reflective structure 31 may include a transparent oxide layer, such as indium tin oxide (ITO) or zinc oxide (ZnO).

The preliminary insulating layer 29 may cover the mesa M around the reflective structure 31. The preliminary insulating layer 29 may be formed of $SiO_2$ using a chemical vapor deposition method or the like, and may cover the side surface of the mesa M and some areas of the n-type semiconductor layer 23. The preliminary insulating layer 29 may be removed from a lower portion of the inclined surface of the separation area I, and may be remained on an upper portion of the inclined surface and a stepped portion of the separation area I as shown in FIG. 10D.

The lower insulating layer 33 covers the mesa M, the reflective structure 31, and the preliminary insulating layer 29. In addition, the lower insulating layer 33 covers the separation area I, the sidewall of the mesa M, and portions of the n-type semiconductor layer 23 around the mesa M. As shown in an enlarged view of FIG. 10D and FIG. 10E, when the substrate 21 is the patterned sapphire substrate, the lower insulating layer 33 may be formed along a shape of protrusions formed on the substrate 21 in the separation area I.

The lower insulating layer 33 may be disposed between the first, second, and third contact layers 35a, 35b, and 35c. The first and second light emitting cells C1 and C2 and may provide a passage through which the first, second, and third contact layers 35a, 35b, and 35c make contact with the n-type semiconductor layer 23 or the reflective structure 31. For example, the lower insulating layer 33 may include a hole 33a through which the reflective structure 31 is exposed on the first light emitting cell C1, a hole 33b through which the reflective structure 31 is exposed on the second light emitting cell C2, and an opening 33c through which the n-type semiconductor layer 23 is exposed in the through hole 27a. In addition, the lower insulating layer 33 exposes areas near the edge of the n-type semiconductor layer 23 while covering a periphery of the mesa M.

The hole 33a may have an elongated shape that is substantially parallel to the separation area I as shown in FIG. 10A, and may be disposed closer to the separation area I than the through hole 27a. Accordingly, a current may be injected into a wider area in the reflective structure 31 on the first light emitting cell C1. In the illustrated exemplary embodiment, the reflective structure 31 disposed on the first light emitting cell C1 is exposed through the single hole 33a, however, in some exemplary embodiments, the hole 33a may be provided in a plural number.

The hole 33b may be defined above the second light emitting cell C2 and may be provided in a plural number as shown in FIG. 10A. In the illustrated exemplary embodiment, five holes 33b are shown, however, the inventive concepts are not limited to a particular number of the holes 33b, and in some exemplary embodiments, less number of holes 33b or more number of holes 33b than the five holes 33b may be arranged. A center of the entire holes 33b is located farther from the separation area I than the center of the mesa M. Therefore, the current may be prevented from concentrating near the separation area I, and may be distributed in the wide area of the second light emitting cell C2.

The opening 33C exposes the n-type semiconductor layer 23 in the through hole 27a to provide a passage through which the first contact layer 35a and the second contact layer 35b make contact with the n-type semiconductor layer 23.

The lower insulating layer 33 may include an insulating material, such as $SiO_2$ or $Si_3N_4$, and may have a single-layer or multi-layer structure. In addition, the lower insulating layer 33 may include a distributed Bragg reflector formed by repeatedly stacking material layers having different refractive indices from each other, for example, $SiO_2/TiO_2$. When the lower insulating layer 33 includes the distributed Bragg reflector, light incident into an area except for the reflective structure 31 may be reflected, and thus, a light extraction efficiency may be further improved.

The first contact layer 35a is disposed on the first light emitting cell C1 and is in ohmic contact with the n-type semiconductor layer 23. The first contact layer 35a may be in ohmic contact with the n-type semiconductor layer 23 along the periphery of the mesa M between the outer side surface of the n-type semiconductor layer 23 and the mesa M. In addition, the first contact layer 35a may be in ohmic contact with the n-type semiconductor layer 23 exposed through the opening 33c of the lower insulating layer 33 in the through hole 27a of the mesa M. Further, the first contact layer 35a may cover the upper area and the side surface of the mesa M except for some areas around the hole 33a.

The second contact layer 35b is in ohmic contact with the n-type semiconductor layer 23 of the second light emitting cell C2, and makes contact with the reflective structure 31 of the first light emitting cell C1. Accordingly, the second contact layer 35b electrically connects the p-type semiconductor layer 27 of the first light emitting cell C1 and the n-type semiconductor layer 23 of the second light emitting cell C2.

The second contact layer 35b may be in ohmic contact with the n-type semiconductor layer 23 along the periphery of the mesa M between the outer side surface of the n-type semiconductor layer 23 and the mesa M. In addition, the second contact layer 35b may be in ohmic contact with the n-type semiconductor layer 23 exposed through the opening 33c of the lower insulating layer 33 in the through hole 27a of the mesa M. Further, the second contact layer 35b makes contact with the reflective structure 31 exposed through the hole 33a. As such, the second contact layer 35b extends from the second light emitting cell C2 to the first light emitting cell C1 after passing through the upper portion of the separation area I. In this case, the second contact layer 35b, which passes through the upper portion of the separation area I, is disposed within a width of the mesa M as shown in FIG. 10A. Thus, the second contact layer 35b may be prevented from being short-circuited with the n-type semiconductor layer 23 of the first light emitting cell C1. In addition, since the second contact layer 35b is relatively gently inclined and passes through the separation area I that has a step structure, a process stability may be improved. In some exemplary embodiments, the second contact layer 35b may be disposed on the lower insulating layer 33 in the separation area I, and may be formed to have concave-convex portions along the shape of the lower insulating layer 33.

The third contact layer 35c is disposed on the lower insulating layer 33 above the second light emitting cell C2. The third contact layer 35c makes contact with the reflective structure 31 via the holes 33b of the lower insulating layer 33, and is electrically connected to the p-type semiconductor layer 27 through the reflective structure 31. The third contact layer 35c may be disposed in an area surrounded by the second contact layer 35b, and may have a shape partially surrounding the second through hole 27a. The third contact layer 35c is disposed at the same level as the first and second contact layers 35a and 35b, and helps the resin layer 37 and the first and second electrode pads 39a and 39b to be easily formed thereon. In some exemplary embodiments, the third contact layer 35c may be omitted.

According to an exemplary embodiment, the first, second, and third contact layers 35a, 35b, and 35c may be formed by the same process using the same material. The first, second, and third contact layers 35a, 35b, and 35c may include a high-reflectance metal layer, such as an Al layer, and the high-reflectance metal layer may be formed on an adhesive layer, e.g., a Ti, Cr, or Ni layer. In addition, a protective layer having a single-layer or multi-layer structure of Ni, Cr, and/or Au may be disposed on the high-reflectance metal layer. In some exemplary embodiments, the first, second, and third contact layers 35a, 35b, and 35c may have a multi-layer structure of Cr/Al/Ni/Ti/Ni/Ti/Au/Ti.

The resin layer 37 is disposed on the first contact layer 35a and the second contact layer 35b. The resin layer 37 is provided with a first via hole 37a defined therethrough to expose the first contact layer 35a, and a second via hole 37b defined therethrough to expose the third contact layer 35c. When viewed in a plan view, the first and second via holes 37a and 37b are formed in a shape partially surrounding the first through hole 27a and the second through hole. When the third contact layer 35c is omitted in some exemplary embodiments, the lower insulating layer 33 and the holes 33b of the lower insulating layer 33 may be exposed through the second via hole 37b.

The resin layer 37 may include concave portions 37c above the first through hole 27a and the second through hole 27b. The concave portions 37c may be formed to correspond to the first through hole 27a and the second through hole 27b.

The resin layer 37 covers the first and second contact layers 35a and 35b that make contact with the n-type semiconductor layer 23 in the periphery of the mesa M. As shown in FIGS. 10B to 10D, an area between the first and second contact layers 35a and 35b and the edge of the n-type semiconductor layer 23 may be covered by the resin layer 37. Accordingly, the first and second contact layers 35a and 35b may be protected from an external environment, such as moisture, by the resin layer 37. The resin layer 37 may cover the second contact layer 35b on the separation area I and may be formed on the separation area I to have a concave portion along the shape of the second contact layer 35b.

The resin layer 37 may include a photosensitive resin, such as a photoresist, and may be formed by a spin coating method, for example. Meanwhile, the first and second via holes 37a and 37b may be formed by a photo-development process, without being limited thereto.

The first electrode pad 39a fills the first via hole 37a of the resin layer 37 and is electrically connected to the first contact layer 35a. In addition, the second electrode pad 39b fills the second via hole 37b and is electrically connected to the third contact layer 35c. When the third contact layer 35c is omitted in some exemplary embodiments, the second electrode pad 39b may be directly connected to the reflective structure 31. As shown in FIG. 10A, the first electrode pad 39a and the second electrode pad 39b may partially surround the first through hole 27a and the second through hole 27b, respectively, when viewed in a plan view. Thus, the first electrode pad 39a and the second electrode pad 39b partially surround the concave portions 37c. The first electrode pad 39a and the second electrode pad 39b may surround at least ½ of a circumference of the first through hole 27a and the second through hole 27b, and in some exemplary embodiments, ⅔ or more of the circumference of the first through hole 27a and the second through hole 27b. In addition, the first electrode pad 39a and the second electrode pad 39b may protrude upward from the resin layer 37. Accordingly, deep grooves may be formed above the areas corresponding to the first and second through holes 27a and 27b. When the light emitting diode chip 20 is bonded with a conductive adhesive, such as solder, using the grooves, the solder is trapped in the grooves, and thus, the solder may be prevented from overflowing to the outside. The first electrode pad 39a and the second electrode pad 39b may be confined within the upper area of the mesa M.

Figure 11A:
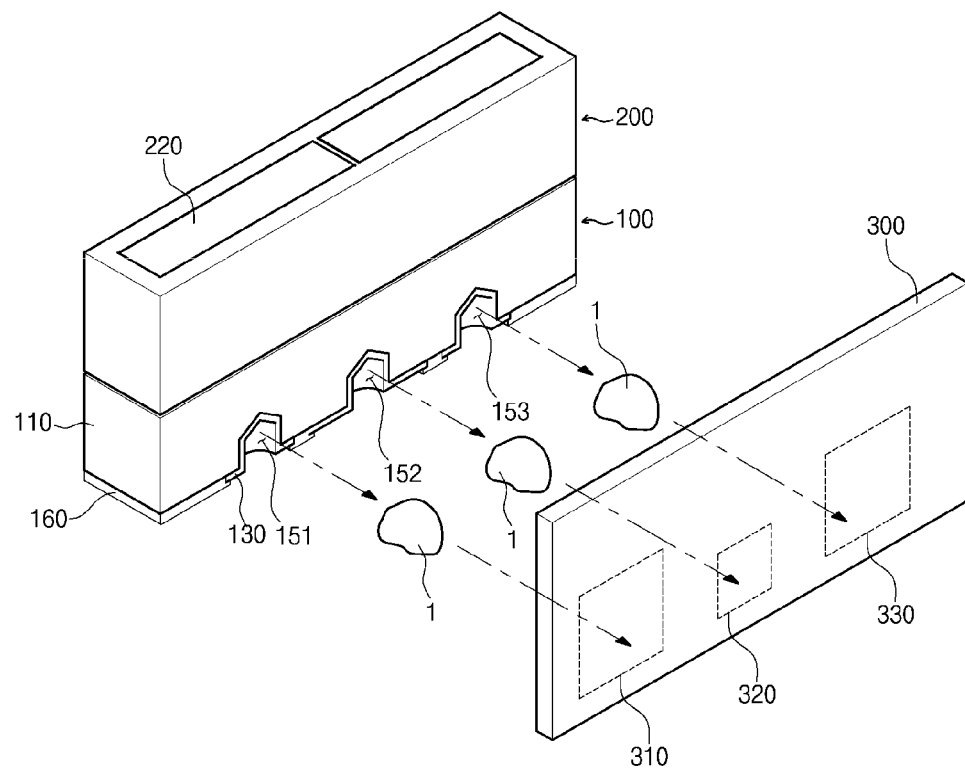
FIGS. 11A and 11B are perspective views of a light emitting diode module according to an exemplary embodiment.
Figure 11B:
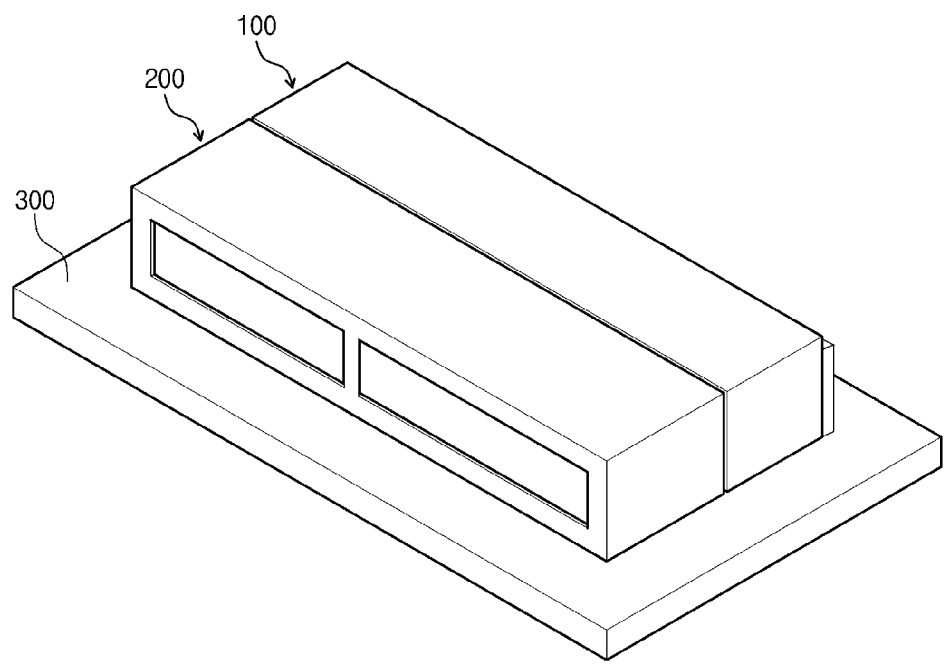

FIGS. 11A and 11B are perspective views of a light emitting diode module according to an exemplary embodiment.

FIG. 11A is a view exemplarily illustrating a process of attaching the light emitting diode 10 to the external frame 300 using the solder paste 1. FIG. 11B is a view of a completed light emitting diode module according to an exemplary embodiment.

Referring to FIG. 11A, the light emitting diode 10, the external frame 300, and the solder paste 1 attaching the light emitting diode 10 to the external frame 300 are provided.

The solder paste 1 is provided in the first solder hole 151, the second solder hole 152, and the third solder hole 153 of the light emitting diode 10. The first lower electrode of the light emitting diode 10 is electrically connected to a first electrode 310 of the external frame 300 by the solder paste 1 provided in the first solder hole 151, and a lower anode of the light emitting diode 10 is electrically connected to a third electrode 330 of the external frame 300 by the solder paste 1 provided in the second solder hole 152. In addition, the third lower electrode of the light emitting diode 10 is electrically connected to a second electrode 320 by the solder paste 1 provided in the third solder hole 153.

Since the solder paste 1 is inserted into the first, second, and third solder holes 151, 152, and 153 formed inside the lead frame unit 100, the light emitting diode module according to the illustrated exemplary embodiment may minimize the area occupied by the solder paste 1, thereby providing a greater degree of miniaturization.

More particularly, as the solder paste 1 is provided in the first, second, and third solder holes 151, 152, and 153 defined over the second surface and the third surface of the body portion 110, the contact area between the solder paste 1 and the body portion 110 may be increased. Accordingly, the connection between the external frame 300 and the body portion 110 by the solder paste 1 may become more stable.

As used herein, the "solder paste" refers to a final adhesive layer formed using a paste that is a mixture of metal powder, flux, and organic material. In addition, when describing a manufacturing method of the light emitting diode module, the "solder paste" may also refer to the paste that is the mixture of the metal powder, the flux, and the organic material. For example, the solder paste 1 may include Sn and another metal. The solder paste 1 may include about 50% or more, about 60% or more, or about 90% or more of Sn relative to the total metal weight. For example, the solder paste 1 may include a lead-containing solder alloy, such as Sn—Pb or Sn—Pb—Ag alloy, or a lead-free solder alloy, such as Sn—Ag alloy, Sn—Bi alloy, Sn—Zn alloy, Sn—Sb, or Sn—Ag—Cu alloy.

FIG. 11B shows the light emitting diode module according to an exemplary embodiment. As shown in FIG. 11B, the light emitting diode module may irradiate light in a direction parallel to the external frame 300, and thus, the light emitting diode module may be a side-type light emitting diode module.

Figure 12A:
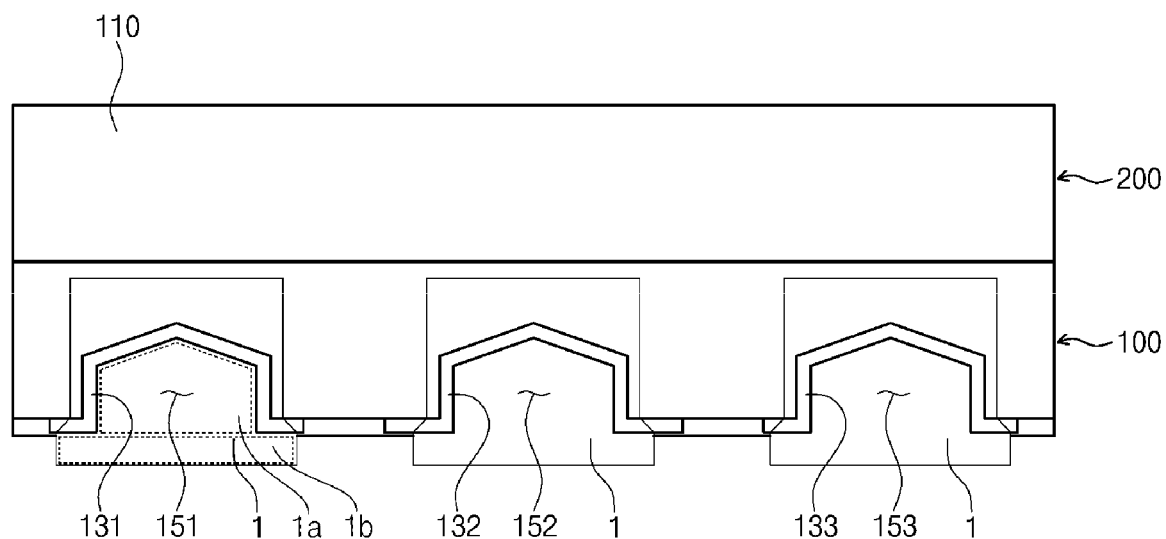
FIGS. 12A and 12B are cross-sectional views of a light emitting diode module according to an exemplary embodiment.
Figure 12B:
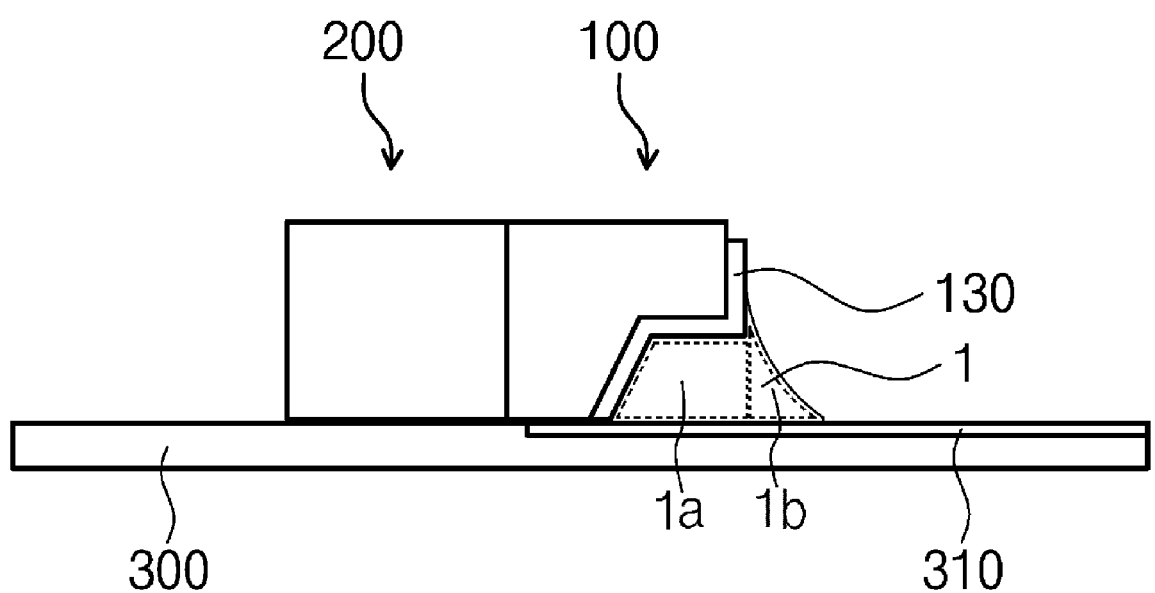

FIGS. 12A and 12B are cross-sectional views of a light emitting diode module according to an exemplary embodiment. FIGS. 12A and 12B show the form of the solder paste in more detail.

Referring to FIG. 12A, the solder paste 1 may be disposed to completely cover the first, second, and third solder holes 151, 152, and 153 when viewed from the side surface. In detail, the solder paste 1 may have a height corresponding to about 150% to about 180% of a height of the first, second, and third solder holes 151, 152, and 153. When the solder paste 1 has the height in the above range, the lead frame unit 100 and the external frame 300 may be stably connected to each other while preventing unintended electrical connection (e.g., short circuit) from occurring.

Referring to FIG. 12B, the solder paste 1 may be disposed to fill the first solder hole 151. In addition, at least a portion of the solder paste 1 may extend to the outside of the lead frame unit 100. For example, as shown in FIG. 12B, a portion of the solder paste 1 may be provided in the form of gentle parabola outside the lead frame unit 100.

In detail, the solder paste 1 may be disposed in the first solder hole 151 or in a first area 1a between the second conductive layer and the external frame 300 and a second area 1b outside the first solder hole 151. In this case, the second area 1b in which the solder paste 1 is provided may include at least a portion of the second conductive layer, and thus, the solder paste 1 provided in the second area 1b may cover at least the portion of the second conductive layer.

When the solder paste 1 is disposed as described above, a horizontal or vertical movement of the external frame 300 may be limited. In addition, the electrical connection between the second conductive layer and the external frame 300 by the solder paste may be further strengthened.

As described above, the electrical and mechanical stability may be improved by providing more solder paste 1 than the capacity of the first, second, and third solder holes 151, 152, and 153.

The first electrode 310 may be embedded in the external frame 300. Accordingly, although the first electrode 310 is provided, the external frame 300 and the backlight unit including the external frame 300 may maintain slim thickness.

Figure 13:
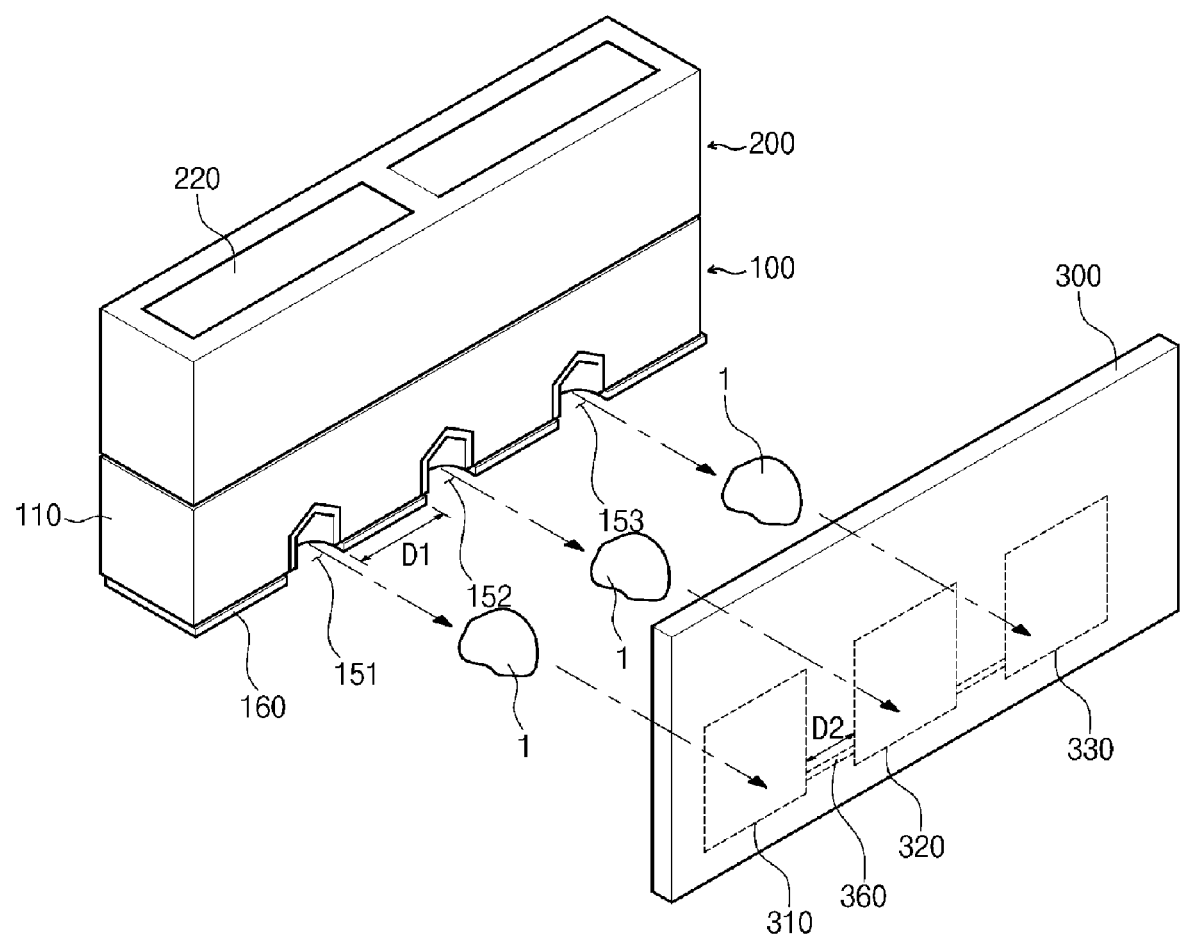
FIG. 13 is a perspective view of a light emitting diode module according to an exemplary embodiment.

FIG. 13 is a perspective view of a light emitting diode module according to an exemplary embodiment.

Referring to FIG. 13, the solder insulating layer 160 is disposed on the second surface of the body portion 110 of the lead frame unit 100 and protrudes toward the external frame 300.

The solder insulating layer 160 may be disposed between the first, second, and third lower electrodes of the body portion 110. In addition, the solder insulating layer 160 disposed between the first, second, and third lower electrodes may have a first width D1.

The protruding portion of the solder insulating layer 160 may make contact with the external frame 300. In particular, when the lead frame unit 100 and the external frame 300 are attached to each other by the solder paste 1, the protruding portion of the solder insulating layer 160 may be disposed between the solder pastes 1. The solder insulating layer 160 disposed between the solder pastes 1 may prevent the lead frame unit 100 and the external frame 300 from moving in a horizontal direction, e.g., a direction substantially perpendicular to a direction in which the lead frame unit 100 and the external frame 300 are attached to each other.

According to an exemplary embodiment, a concave portion 360 may be disposed on the external frame 300. The concave portion 360 may be disposed between the first electrode 310 and the second electrode 320 and between the second electrode 320 and the third electrode 330. The concave portion 360 may have a shape corresponding to the protruding portion of the solder insulating layer 160. In this manner, when the lead frame unit 100 is coupled to the external frame 300, at least a portion of the protruding portion of the solder insulating layer 160 may be inserted into the concave portion 360.

When the concave portion 360 is provided, the concave portion 360 may have a second width D2, which may be substantially equal to the first width D1 of the solder insulating layer 160. In this case, the protruding portion of the solder insulating layer 160, which is inserted into the concave portion 360, may be prevented from moving to the left and right, and the lateral external force applied to the solder paste 1 may be reduced.

As the solder insulating layer 160 and the external frame 300 are provided in the above-mentioned structure, the structural stability of the light emitting diode may be improved.

Figure 14:
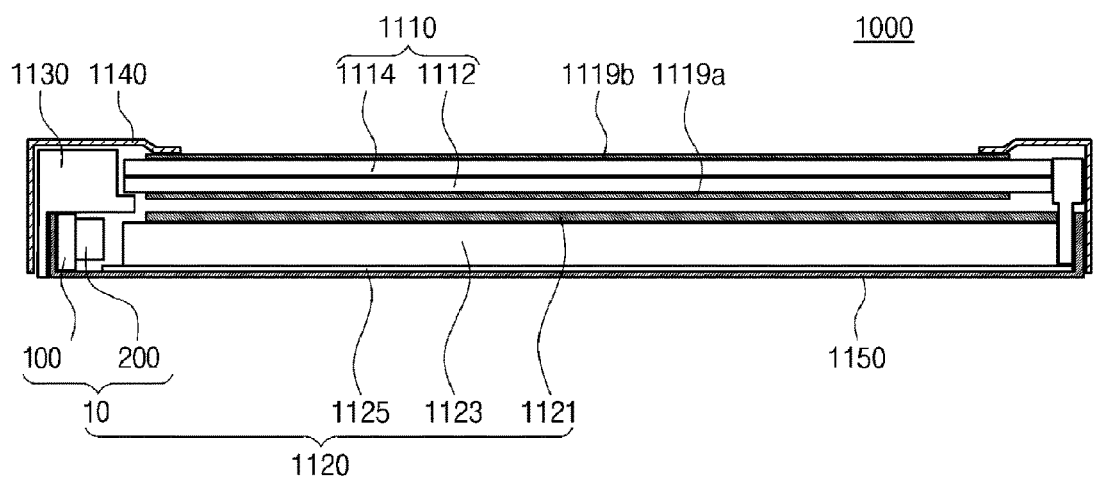
FIG. 14 is a cross-sectional view of a display device to which a light emitting diode module is applied according to an exemplary embodiment.

FIG. 14 is a cross-sectional view of a display device to which a light emitting diode module is applied according to an exemplary embodiment.

Referring to FIG. 14, a display device 1000 includes a liquid crystal panel 1110, a backlight unit 1120, a support main 1130, a cover bottom 1150, and a top cover 1140.

The liquid crystal panel 1110 may be a main component to display an image, and includes first and second substrates 1112 and 1114 coupled to each other with a liquid crystal layer interposed therebetween. The backlight unit is disposed at a rear side of the liquid crystal panel 1110.

The backlight unit 1120 includes a light emitting diode module 1160 arranged along a longitudinal direction of at least one edge of the support main 1130, a reflective plate 1125 having a white or silver color, for example, and disposed on the cover bottom 1150, a light guide plate 1123 disposed on the reflective plate 1125, and a plurality of optical sheets 1121 disposed above the light guide plate 1123.

The light emitting diode module may include the light emitting diode described with reference to FIGS. 1 to 12B, and may be implemented as the side-type light emitting diode module.

Accordingly, the light emitting diode module of the backlight unit 1120 may effectively dissipate heat, and thus, the display device 1000 of FIG. 14 may have a small temperature rise width even when used for a long time, and may stably display an image without a luminance change.

FIGS. 15A to 15D are plan views showing an upper surface of a mother substrate MS according to an exemplary embodiment.

Figure 15A:
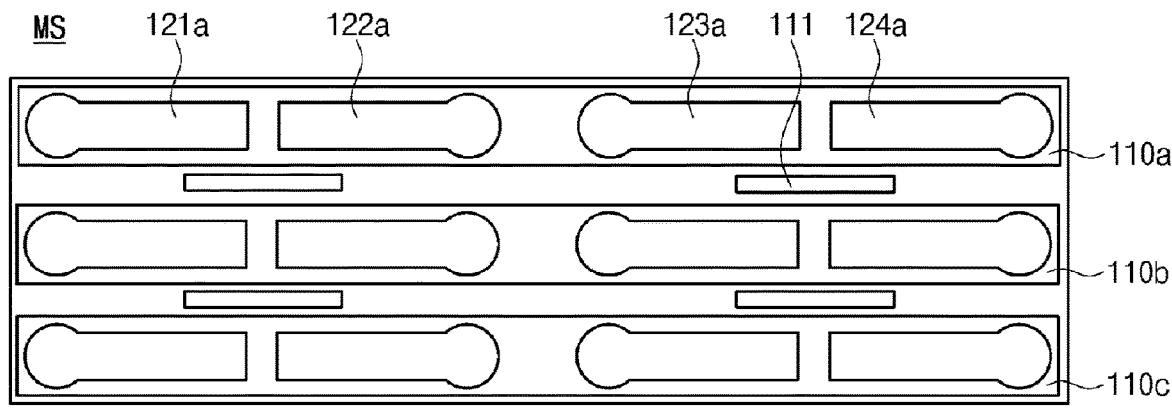
FIGS. 15A, 15B, 15C, and 15D are plan views of an upper surface of a mother substrate according to an exemplary embodiment.

Referring to FIG. 15A, the mother substrate MS includes a plurality of substrate patterns 110a, 110b, and 110c, and an alignment mark 111.

The substrate included in the light emitting diode may be manufactured by dicing the mother substrate MS. As such, the mother substrate MS is provided with the substrate patterns 110a, 110b and 110c that may become substrates after the dicing process.

According to the illustrated exemplary embodiment, the mother substrate MS may include first, second, and third substrate patterns 110a, 110b, and 110c. However, the inventive concepts are not limited thereto, and in some exemplary embodiments, the mother substrate MS may include more number of substrate patterns or less number of substrate patterns than the first to third substrate patterns 110a, 110b, and 110c.

For example, the first substrate pattern 110a has the same edge as the substrate on the mother substrate MS. The edge may not perform any electrical function when the substrate is manufactured, and the edge is used to distinguish substrates different from each other during the dicing and patterning processes.

As the first substrate pattern 110a includes the edge, more substrates may be substantially simultaneously manufactured. In detail, according to a conventional process, since each substrate is manufactured using a mold, there is a spatial limitation in manufacturing large number of substrates at the same time. However, according to the exemplary embodiments, the substrates may be manufactured by forming the substrate patterns 110a, 110b, and 110c, which are distinguished from each other by the edge, on one mother substrate MS and dicing between the substrate patterns 110a, 110b, and 110c. Accordingly, multiple substrates may be substantially simultaneously manufactured as long as there is a space to perform the dicing process. Therefore, the illustrated processes according to the exemplary embodiments may manufacture a greater number of substrates substantially simultaneously as compared with the conventional processes.

The first substrate pattern 110a may include a first upper electrode pattern 121a, a second upper electrode pattern 122a, a third upper electrode pattern 123a, and a fourth upper electrode pattern 124a. The first upper electrode pattern 121a, the second upper electrode pattern 122a, the third upper electrode pattern 123a, and the fourth upper electrode pattern 124a may be formed by forming a conductive layer on the mother substrate MS and patterning the conductive layer.

Among them, the first upper electrode pattern 121a will be described as a representative example. The first upper electrode pattern 121a may include a circular portion and an elongated portion. The circular portion may have a circular shape and may be provided integrally with the elongated portion at one side of the elongated portion.

Since the first upper electrode pattern 121a includes the circular portion and the elongated portion, the first upper electrode pattern 121a may not stick out from the first substrate pattern 110a. In detail, when the conductive layer provided on the mother substrate MS is patterned to form the first upper electrode pattern 121a, the first upper electrode pattern 121a may be inclined due to process errors. When the first upper electrode pattern 121a has a substantially rectangular shape with a corner at its end, the corner may protrude to the outside of the first substrate pattern 110a even though the first upper electrode pattern 121a is slightly inclined. When a portion of the first upper electrode pattern 121a protrudes to the outside of the first substrate pattern 110a, the first upper electrode may be exposed to a side surface of a first substrate after the dicing process, and thus, unintended short-circuit may occur via the first upper electrode.

According to an exemplary embodiment, since the circular portion having the circular shape is provided at the end of the first upper electrode pattern 121a, the probability that the end of the first upper electrode pattern 121a is exposed to the outside of the first substrate pattern 110a is lowered even though the first upper electrode pattern 121a is inclined. Therefore, the probability that the unintended short-circuit occurs via the first upper electrode formed by the dicing process may be lowered.

Meanwhile, in the above description, the first upper electrode pattern 121a has been described as a representative example among the first upper electrode pattern 121a, the second upper electrode pattern 122a, the third upper electrode pattern 123a, and the fourth upper electrode pattern 124a. However, the structures and functions of the first upper electrode pattern 121a may be applied equally to the second upper electrode pattern 122a, the third upper electrode pattern 123a, and the fourth upper electrode pattern 124a.

The alignment mark 111 is disposed between the first, second, and third substrate patterns 110a, 110b, and 110c. The alignment mark 111 allows the mother substrate MS to be accurately aligned in the dicing process. As used herein, the term "accurately aligned" refers that the mother substrate MS is located such that the first, second, and third substrate patterns 110a, 110b, and 110c remain intact without being cut off by the dicing process.

The alignment mark 111 may be formed with the first, second, and third substrate patterns 110a, 110b, and 110c through the same process. For example, a conductive layer is formed on the mother substrate MS and patterned to remain the first, second, and third substrate patterns 110a, 110b, and 110c and the alignment mark 111.

The alignment mark 111 may have a width smaller than a width between the first, second, and third substrate patterns 110a, 110b, and 110c. Thus, although the alignment mark 111 is inclined in the patterning process of the alignment mark 111, the inclined alignment mark 111 is not connected to the first, second, and third substrate patterns 110a, 110b, and 110c.

In addition, the width of the alignment mark 111 may be smaller than a width of a blade used in the dicing process. Therefore, the alignment mark 111 may be removed in the process of dicing the mother substrate MS along the alignment mark 111. When the alignment mark 111 is not removed in the dicing process, the remaining alignment mark 111 may be exposed at the side surface of the substrate. In particular, since the alignment mark 111 may have a conductivity as the first upper electrode pattern 121a, the exposed alignment mark 111 may cause short-circuit. Accordingly, the alignment mark 111 according to an exemplary embodiment has the width smaller than the width of the dicing blade, and thus, the alignment mark 111 is prevented from remaining on the substrate, thereby preventing the unintended short-circuit from occurring.

Figure 15B:
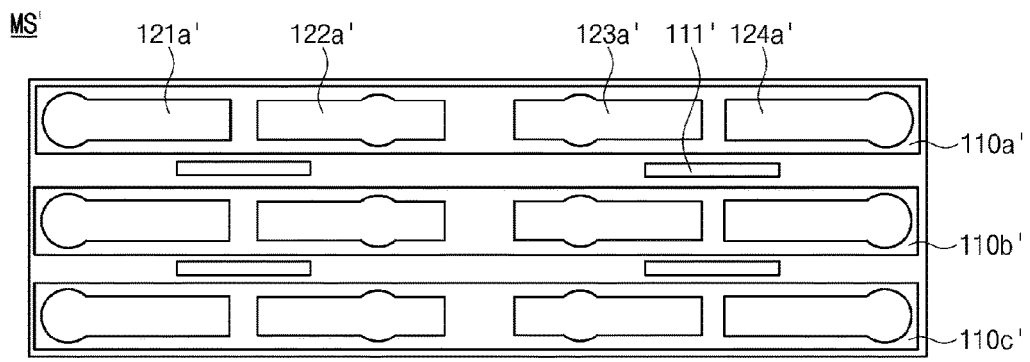

Referring to FIG. 15B, a second upper electrode pattern 122a' and a third upper electrode pattern 123a' have a different shape from a first upper electrode pattern 121a' and a fourth upper electrode pattern 124a', respectively. The shape of the mask used in the patterning process may be changed to change the shape of the second upper electrode pattern 122a' and the third upper electrode pattern 123a' to be different from the shape of the first upper electrode pattern 121a' and the fourth upper electrode pattern 124a'.

As the shape of the second upper electrode pattern 122a' and the third upper electrode pattern 123a' is different from the shape of the first upper electrode pattern 121a' and the fourth upper electrode pattern 124a', respectively, the cathode and the anode may be easily distinguished from each other after the dicing process. Accordingly, when mounting the light emitting diode chip on the lead frame unit, the pad portion of the light emitting diode chip and the electrode of the lead frame unit may be prevented from being matched incorrectly.

In some exemplary embodiments, the second substrate pattern 110b' may be rotated by about 180 degrees when the dicing process is performed and the light emitting diode is mounted.

Figure 15C:
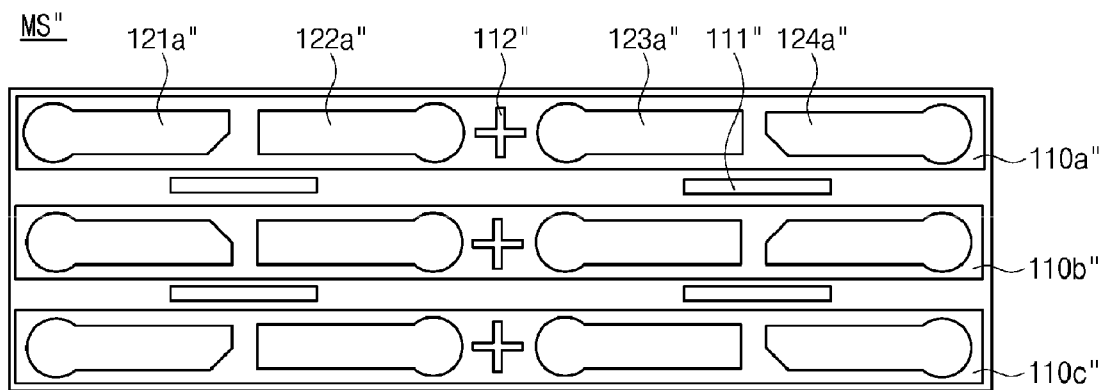

Referring to FIG. 15C, a mother substrate MS" includes a first alignment mark 111" and a second alignment mark 112".

The second alignment mark 112" may be disposed between a first anode mark 122a" and a second anode mark 123a". The second alignment marks 112" is used together with the first alignment mark 111" to align the mother substrate MS'' such that first, second, and third substrate patterns 110a''', 110b''', 110c''' are not damaged in the dicing process.

The second alignment mark 112'' may be formed together with a first cathode pattern 121a'' through the same process when the first cathode pattern 121a'' is formed. Accordingly, the second alignment mark 112'' may have conductivity. As such, the second alignment mark 112'' may be formed so as not to cross the first substrate pattern 110a'' or not to meet the first anode pattern 122a'' or the second anode pattern 123a''. The shape of the second alignment mark 112'' is not particularly limited, and thus, in some exemplary embodiments, the second alignment mark 112'' having various shapes other than a cross shape may be manufactured.

Figure 15D:
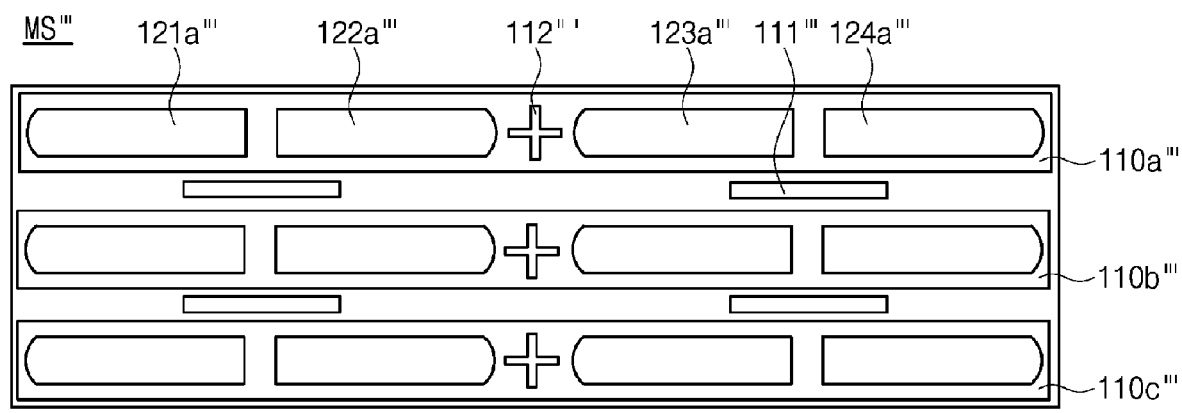

Referring to FIG. 15D, each of a first upper electrode pattern 121a''', a second upper electrode pattern 122a''', a third upper electrode pattern 123a''', and a fourth upper electrode pattern 124a''' has a substantially rectangular shape having one rounded end. When the first upper electrode pattern 121a''', the second upper electrode pattern 122a''', the third upper electrode pattern 123a''', and the fourth upper electrode pattern 124a''' have the substantially rectangular shape with one rounded end, the ease in operation of digging the via hole may be secured, and the first to fourth upper electrode patterns 121a''' to 124a''' may be prevented from being exposed to the outside of the substrate.

Figure 16A:
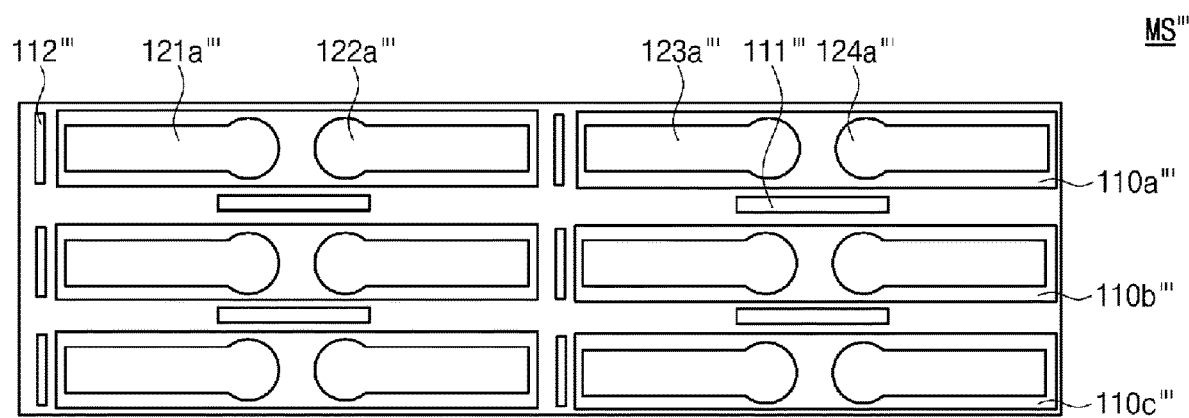
FIGS. 16A and 16B are plan views of an upper surface of a mother substrate according to an exemplary embodiment.
Figure 16B:
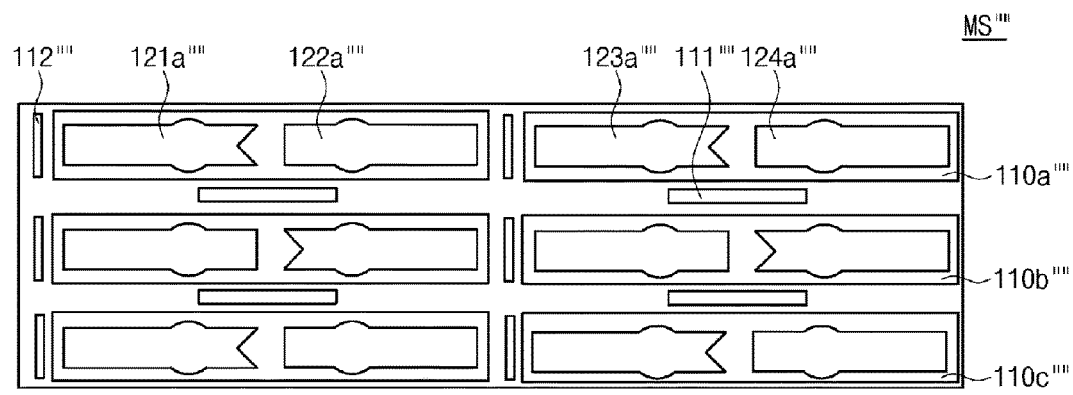

FIGS. 16A and 16B are plan views of an upper surface of a mother substrate according to an exemplary embodiment.

Referring to FIGS. 16A and 16B, a first substrate pattern 110a''' includes a cathode pattern 123a''' and an anode pattern 124a'''. Since the first substrate pattern 110a''' includes one cathode pattern 123a''' and one anode pattern 124a''', a plurality of substrate patterns 110a''', 110b''', and 110c''' may be arranged in a matrix form.

In addition, a first alignment mark 111''' and a second alignment mark 112''' may be disposed between the substrate patterns 110a''', 110b''', and 110c'''. The first alignment mark 111''' may be arranged in a column direction of the substrate patterns 110a''', 110b''', and 110c''', and the second alignment mark 112''' may be arranged in a row direction of the substrate patterns 110a''', 110b''', and 110c''.

As shown in FIG. 16B, the cathode pattern 123a''' and the anode pattern 124a''' may have different shapes from each other. As the cathode pattern 123a''' and the anode pattern 124a''' have different shapes from each other, the light emitting diode chip may be easily mounted.

Figure 17:
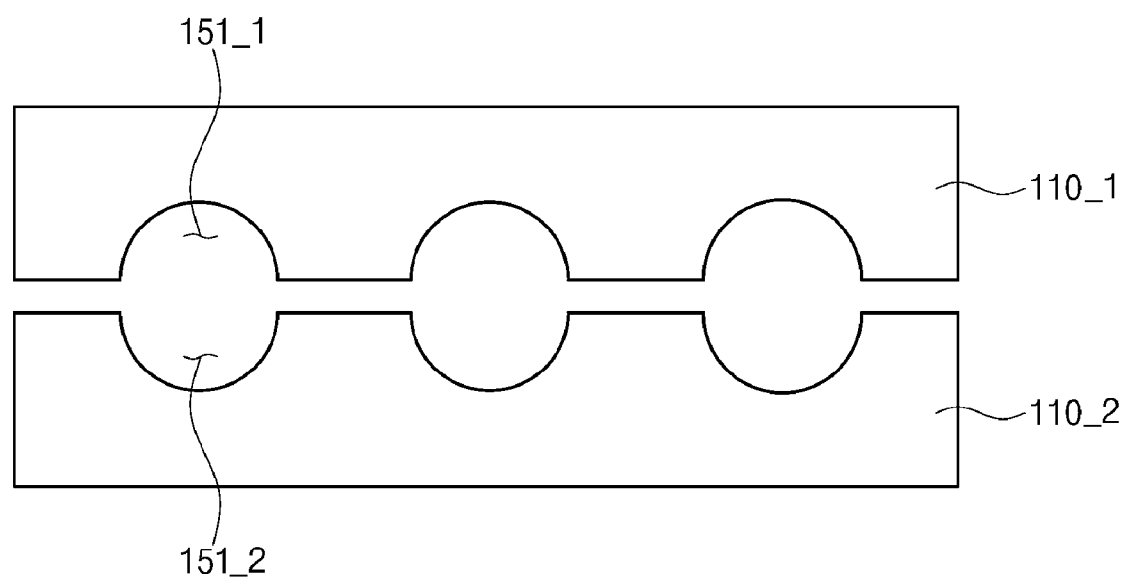
FIG. 17 is a plan view of a lower surface of a body portion according to an exemplary embodiment.

FIG. 17 is a plan view of a lower surface of a body portion according to an exemplary embodiment.

Referring to FIG. 17, a first body portion 110_1 and a second body portion 110_2 are disposed to be substantially symmetrical with each other with respect to a horizontal direction. A first body portion through hole 151_1 and a second body portion through hole 151_2 may be substantially simultaneously formed through the first body portion 110_1 and the second body portion 110_2, respectively.

Since the first body portion through hole 151_1 and the second body portion through hole 151_2 are substantially simultaneously formed through the first body portion 110_1 and the second body portion 110_2, respectively, the process efficiency may be improved.

According to exemplary embodiments, a thinner light emitting diode and a thinner light emitting diode module may be provided, with a higher degree of integration.

In addition, according to the exemplary embodiments, the occurrence of short-circuit occurs in the light emitting diode and light emitting diode module may be substantially prevented or suppressed, and heat resistance of the light emitting diode and the light emitting diode module may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting diode comprising:
a lead frame unit; and
a light source unit disposed on the lead frame unit, the lead frame unit comprising:
a body portion having a first surface contacting the light source unit and a second surface opposite to the first surface, the body portion including at least one solder hole recessed from the second surface of the body portion;
a first conductive layer disposed on the first surface of the body portion;
a second conductive layer disposed on the second surface of the body portion; and
a connection portion disposed on a through hole defined through the body portion between the first conductive layer and the second conductive layer, the connection portion comprising:
a connection portion conductive layer disposed on a surface of the through hole;
a plug disposed on the connection portion conductive layer and filling the through hole; and
a cover plate disposed on the through hole to cover the through hole.

2. The light emitting diode of claim 1, wherein the cover plate has a same shape as the connection portion conductive layer on the first surface and the second surface of the body portion.

3. The light emitting diode of claim 1, further comprising a solder insulating layer disposed on the second surface, wherein the solder insulating layer covers at least a portion of the second conductive layer disposed between the solder holes.

4. The light emitting diode of claim 1, wherein the solder hole and the connection portion are spaced apart from each other by at least about 50 μm when viewed from the second surface.

5. The light emitting diode of claim 1, wherein:
the light source unit comprises a first light emitting diode chip and a second light emitting diode chip;
the first light emitting diode chip and the second light emitting diode chip are spaced apart from each other by a first interval when viewed from a top of the light source unit;
at least one of the first light emitting diode chip and the second light emitting diode chip is spaced apart from an edge of the light source unit by a light emitting diode chip margin when viewed from a top of the light source unit; and
the first interval is greater than the light emitting diode chip margin.

6. The light emitting diode of claim 5, wherein:
the light source unit has a substantially rectangular shape with long sides and short sides when viewed in a top view;

the first light emitting diode chip and one short side of the light source unit adjacent to the first light emitting diode chip are spaced apart from each other by a second interval;

the second light emitting diode chip and the other short side of the light source unit adjacent to the second light emitting diode chip are spaced apart from each other by a third interval; and the first interval is greater than the second interval and the third interval.

7. The light emitting diode of claim 1, wherein the first conductive layer includes a circular portion having a substantially circular shape and an elongated portion provided integrally with the circular portion and elongating in one direction from the circular portion.

8. The light emitting diode of claim 7, wherein the connection portion overlaps with at least a portion of the circular portion in a plan view.

9. The light emitting diode of claim 7, wherein the elongated portion has a width less than a diameter of the circular portion.

10. The light emitting diode of claim 1, wherein the lead frame unit has a third surface connecting the first surface and the second surface, and the solder hole is defined over the second surface and the third surface.

11. The light emitting diode of claim 10, wherein the solder hole has a substantially semi-circular or substantially semi-elliptical shape in the second surface of the body portion, and has a substantially pentagonal shape in the third surface, and at least one internal angle defined by the substantially pentagonal shape is in a range from about 120 degrees to about 170 degrees.

12. The light emitting diode of claim 10, wherein the solder hole has a substantially semi-circular or substantially semi-elliptical shape in the second surface of the body portion, and a radius of the substantially semi-circular or substantially semi-elliptical shape is in a range from about 10% to about 50% of a thickness of the body portion.

13. The light emitting diode of claim 1, wherein the light source unit comprises a first light emitting diode chip and a second light emitting diode chip disposed on the lead frame unit to be substantially parallel to each other.

14. The light emitting diode of claim 13, wherein the first light emitting diode chip and the second light emitting diode chip are configured to emit light having a same wavelength as each other.

15. The light emitting diode of claim 13, wherein the first conductive layer comprises:
a first upper electrode electrically connected to the first light emitting diode chip;
a second upper electrode electrically connected to the first light emitting diode chip;
a third upper electrode electrically connected to the second light emitting diode chip; and
a fourth upper electrode electrically connected to the second light emitting diode chip.

16. The light emitting diode of claim 13, wherein the first light emitting diode chip and the second light emitting diode chip overlap at least a portion of the first conductive layer in a plan view.

17. The light emitting diode of claim 13, further comprising a first wavelength converter and a second wavelength converter, wherein:
the first light emitting diode chip and the second light emitting diode chip are configured to emit light having a same wavelength as each other;
the first wavelength converter is disposed on the first light emitting diode chip to convert a wavelength of light emitted from the first light emitting diode chip to a first wavelength band; and
the second wavelength converter is disposed on the second light emitting diode chip to convert a wavelength of light emitted from the second light emitting diode chip to a second wavelength band different from the first wavelength band.

18. The light emitting diode of claim 17, wherein a light transmission portion is disposed on the first wavelength converter and the second wavelength converter, and the first wavelength converter and the second wavelength converter have a thickness smaller than a thickness of the light transmission portion.

* * * * *